United States Patent
Bae et al.

(10) Patent No.: US 10,586,836 B2
(45) Date of Patent: Mar. 10, 2020

(54) DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Jung-Bae Bae, Hanam-si (KR); Won Kyu Kwak, Seongnam-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 148 days.

(21) Appl. No.: 15/838,624

(22) Filed: Dec. 12, 2017

(65) Prior Publication Data

US 2018/0226459 A1 Aug. 9, 2018

(30) Foreign Application Priority Data

Feb. 7, 2017 (KR) .......................... 10-2017-0017020

(51) Int. Cl.
*H01L 27/32* (2006.01)
*H01L 27/12* (2006.01)
(Continued)

(52) U.S. Cl.
CPC ........ *H01L 27/3246* (2013.01); *H01L 27/124* (2013.01); *H01L 27/1222* (2013.01);
(Continued)

(58) Field of Classification Search
CPC ............. H01L 27/3262; H01L 27/3265; H01L 27/3276; H01L 27/3248; H01L 27/3246;
(Continued)

(56) References Cited

U.S. PATENT DOCUMENTS 9,177,975 B2 * 11/2015 Cho .................... H01L 27/1255
9,780,331 B2 * 10/2017 Lee ..................... H01L 51/5253
(Continued)

FOREIGN PATENT DOCUMENTS

EP 1524702 4/2005
KR 1020140018623 2/2014
(Continued)

OTHER PUBLICATIONS

European Search Report dated Sep. 21, 2018 in corresponding European Patent Application No. 18155020.3 (10 pages).

*Primary Examiner* — William Lu
(74) *Attorney, Agent, or Firm* — F. Chau & Associates, LLC

(57) ABSTRACT

The present disclosure relates to a display device. An exemplary embodiment of the present invention provides a display device including a substrate and an active pattern positioned above the substrate. to the active pattern includes a channel region and a conductive region having a higher carrier concentration than the channel region. A first insulating layer is disposed on the active pattern. A first conductive layer is disposed on the first insulating layer and includes a first conductor. The channel region of the active pattern includes a first channel region overlapping the first conductor along a direction orthogonal to an upper surface of the substrate. The conductive region of the active pattern includes a first conductive region overlapping the first conductor along the direction orthogonal to the upper surface of the substrate.

17 Claims, 26 Drawing Sheets

(51) Int. Cl.
*H01L 51/52* (2006.01)
*H01L 51/00* (2006.01)
*H01L 51/50* (2006.01)

(52) U.S. Cl.
CPC ...... *H01L 27/3269* (2013.01); *H01L 51/0023* (2013.01); *H01L 51/5237* (2013.01); *G09G 2320/0209* (2013.01); *H01L 51/5092* (2013.01)

(58) Field of Classification Search
CPC .............. H01L 29/66757; H01L 51/56; H01L 29/78696; H01L 2227/323
See application file for complete search history.

(56) References Cited

U.S. PATENT DOCUMENTS

| | | | |
|---|---|---|---|
| 9,865,667 B2* | 1/2018 | Gil | H01L 27/3276 |
| 10,002,916 B2* | 6/2018 | Shin | H01L 27/3276 |
| 2005/0035343 A1* | 2/2005 | Choi | H01L 29/783 |
| | | | 257/16 |
| 2005/0082530 A1* | 4/2005 | Koo | H01L 29/78615 |
| | | | 257/66 |
| 2011/0279356 A1* | 11/2011 | Takemura | G02F 1/13624 |
| | | | 345/76 |
| 2015/0014638 A1* | 1/2015 | Kwon | H01L 27/3265 |
| | | | 257/40 |
| 2016/0035814 A1* | 2/2016 | Jin | H01L 29/78696 |
| | | | 257/40 |
| 2016/0240601 A1* | 8/2016 | Kwon | H01L 27/3276 |
| 2017/0243759 A1* | 8/2017 | Jintyou | H01L 21/0214 |

FOREIGN PATENT DOCUMENTS

| | | |
|---|---|---|
| KR | 1020150019891 | 2/2015 |
| KR | 1020160055546 | 5/2016 |
| KR | 1020160098650 | 8/2016 |

* cited by examiner

DISPLAY DEVICE AND MANUFACTURING METHOD THEREOF

CROSS-REFERENCE TO RELATED APPLICATION

This application claims priority to Korean Patent Application No. 10-2017-0017020 filed in the Korean Intellectual Property Office on Feb. 7, 2017, the disclosure of which is incorporated by reference herein in its entirety.

TECHNICAL FIELD

Exemplary embodiments of the present invention relate to a display device, and more particularly to a manufacturing method thereof.

DISCUSSION OF RELATED ART

A display device may include a plurality of pixels which are units for displaying an image. As an example, a pixel of the display device including an emission layer may include a light emitting diode (LED) including a cathode, an anode, and an emission layer; and a plurality of transistors and at least one capacitor for driving the light emitting diode.

The light emitting diode may include two electrodes and an emission layer disposed therebetween. Electrons injected from a cathode may be combined in the emission layer to form excitons, and the excitons may emit light and energy.

Each of the transistors may include at least one switching transistor and a driving transistor. The at least one switching transistor may receive a data signal depending on a scan signal, and may transfer a corresponding voltage to a driving transistor. The driving transistor may be directly or indirectly connected with the light emitting diode to control an amount of a driving current to be transferred to the light emitting diode such that each of the pixels can emit light of desired luminance.

The capacitor may be connected with a driving gate electrode of the driving transistor to serve to maintain a voltage of the driving gate electrode.

SUMMARY

If a voltage of a driving gate electrode of a driving transistor included in a pixel of the display and/or a voltage of a conductor electrically connected thereto resonate by coupling with other signals, luminance of the pixel may be changed, thus reducing image quality.

According to an exemplary embodiment of the present invention, image quality defects such as inter-pixel color deviation and crosstalk in a display image may be reduced or eliminated.

An exemplary embodiment of the present invention provides a display device including a substrate and an active pattern positioned above the substrate. The active pattern includes a channel region and a conductive region having a higher carrier concentration than the channel region. A first insulating layer is disposed on the active pattern. A first conductive layer is disposed on the first insulating layer and includes a first conductor. The channel region of the active pattern includes a first channel region overlapping the first conductor along a direction orthogonal to an upper surface of the substrate. The conductive region of the active pattern includes a first conductive region overlapping the first conductor along the direction orthogonal to the upper surface of the substrate.

The first conductive region may include a first portion overlapping the first conductor along the direction orthogonal to the upper surface of the substrate and a second portion connected with the first portion and not overlapping the first conductor along the direction orthogonal to the upper surface of the substrate. The channel region of the active pattern may include a second channel region overlapping a second conductor included in the first conductive layer along the direction orthogonal to the upper surface of the substrate. The second portion may be connected with the second channel region.

The first conductive layer may further include a third conductor that is separated from the first conductor and the second conductor, and the second portion of the first conductor may be insulated from and crosses the third conductor.

The first insulating layer may have a contact hole overlapping the first conductor along the direction orthogonal to the upper surface of the substrate. The first conductive region may be electrically connected to the first conductor through the contact hole.

An exemplary embodiment of the present invention provides a display device including an active pattern including a plurality of channel regions and a conductive region having a higher carrier concentration than the channel regions. A first insulating layer is disposed on the active pattern. A first conductive layer disposed on the first insulating layer. The first conductive layer includes a first gate electrode. The channel regions of the active pattern include a first channel region overlapping the first gate electrode along a direction orthogonal to an upper surface of the substrate. The conductive region of the active pattern includes a connector overlapping the first gate electrode along the direction orthogonal to the upper surface of the substrate and separated from the first channel region.

The channel regions of the active pattern further may include a second channel region which is separated from the first channel region and overlaps a second gate electrode included in the first conductive layer along the direction orthogonal to the upper surface of the substrate. The connector may be connected with the second channel region or a portion of the conductive region connected with the second channel region.

The first insulating layer may have a first contact hole formed above the first gate electrode. The connector may be electrically connected to the first gate electrode through the first contact hole.

The first conductive layer may further include a first scan line disposed between the first gate electrode and the second gate electrode. The connector may be insulated from and cross the first scan line.

The channel regions of the active pattern may further include a third channel region which is separated from the first channel region and overlaps the first scan line along the direction orthogonal to the upper surface of the substrate. The connector may be connected with the third channel region or a portion of the conductive region connected with the third channel region.

The active pattern may be physically continuous from the first channel region, via the third channel region, and to the connector.

The display device may include a second insulating layer disposed on the first conductive layer and a second conductive layer disposed on the second insulating layer. The second conductive layer may include a storage line. The storage line may include an expansion overlapping the first gate electrode along the direction orthogonal to the upper surface of the substrate with the second insulating layer disposed between the expansion and the first gate electrode to form a capacitor. The expansion may have a continuous planar shape with no opening therein.

The display device may include a third insulating layer disposed on the second conductive layer and a third conductive layer disposed on the third insulating layer. The third conductive layer may include a driving voltage line for transferring a driving voltage. The third insulating layer may include a second contact hole overlapping the expansion along the direction orthogonal to the upper surface of the substrate. The driving voltage line may be electrically connected to the expansion through the second contact hole.

The first insulating layer and the second insulating layer may have a third contact hole overlapping a portion of the conductive region of the active pattern along the direction orthogonal to the upper surface of the substrate. The second conductive layer may include an initialization voltage line for transferring an initialization voltage.

The initialization voltage line may be electrically connected to a portion of the conductive region of the active pattern through the third contact hole.

The first conductive layer may further include a first scan line separated from the first gate electrode. The channel regions of the active pattern may include a portion overlapping the first scan line along the direction orthogonal to the upper surface of the substrate. The conductive region of the active pattern may include a portion overlapping the first scan line along the direction orthogonal to the upper surface of the substrate.

An exemplary embodiment of the present invention provides a manufacturing method of a display device, including forming a semiconductor pattern on a substrate.

The method includes forming a conductive connector by doping a portion of the semiconductor pattern. The method includes forming a first insulating layer on the semiconductor pattern. The method includes forming a first contact hole on the connector by patterning the first insulating layer. The method includes forming a first conductive layer by stacking a conductive material on the first insulating layer and patterning the stacked conductive material. The method includes forming an active pattern including a plurality of conductive regions and a plurality of channel regions by doping the semiconductor pattern using the first conductive layer as a mask.

The first conductive layer may include a first gate electrode electrically connected to the connector through the first contact hole.

The manufacturing method may include, after the forming of the active pattern, forming a second insulating layer on the first conductive layer. A second contact hole overlapping a portion of the conductive region along the direction orthogonal to the upper surface of the substrate may be formed by patterning the first insulating layer and the second insulating layer.

The manufacturing method may include forming a second conductive layer by stacking a conductive material on the second insulating layer and patterning the stacked conductive material. The second conductive layer may include an initialization voltage line electrically connected to a portion of the conductive region through the second contact hole.

The second conductive layer may include a storage line including an expansion overlapping the first gate electrode along the direction orthogonal to the upper surface of the substrate with the second insulating layer disposed between the expansion and the first gate electrode to form a capacitor.

According to the exemplary embodiments of the present disclosure, it is possible to sufficiently secure the capacitance of the capacitor to which a driving gate electrode is connected, and it is possible to prevent the voltage of the driving gate electrode from undesirably varying by reducing or eliminating generation of a parasitic capacitance that can be formed by using the driving gate electrode and/or a first conductor electrically connected thereto and a second conductor that is adjacent to the first conductor. Thus, it is possible to prevent image quality defects such as inter-pixel color deviation and crosstalk in a display image.

DETAILED DESCRIPTION OF THE EMBODIMENTS

Figure 1:
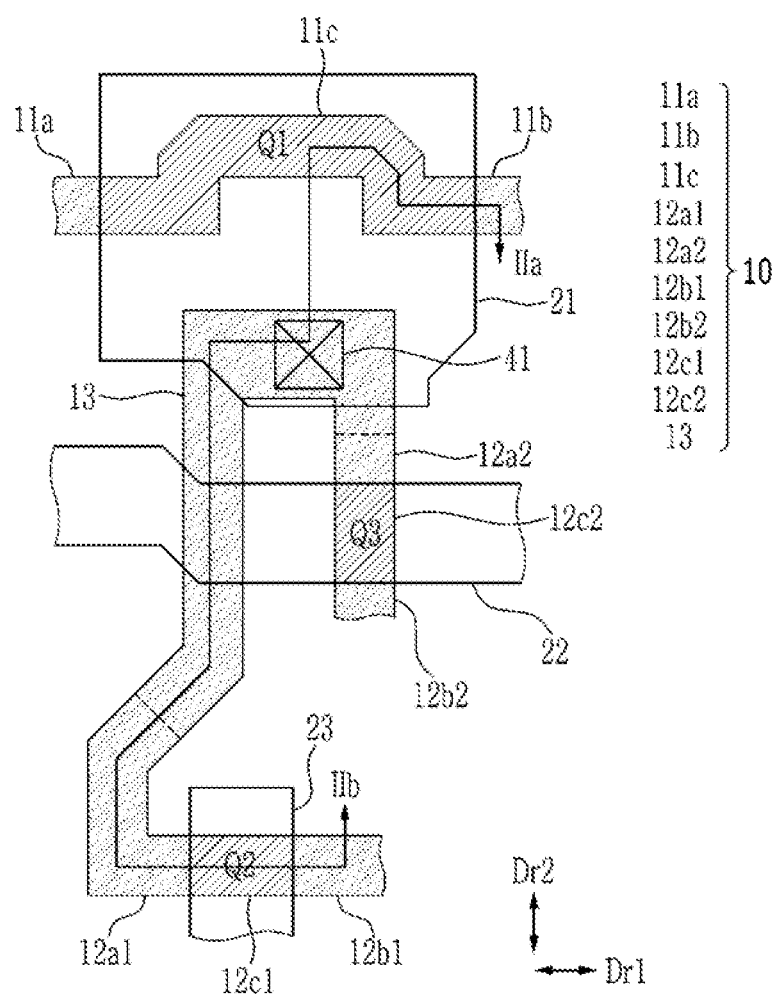
FIG. 1 is a layout view illustrating a portion of a display device according to an exemplary embodiment of the present invention.

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present. The phrase "in a plan view" means when an object portion is viewed from above, and the phrase "in a cross-section" means when a cross-section taken by vertically cutting an object portion is viewed from the side.

Figure 2:
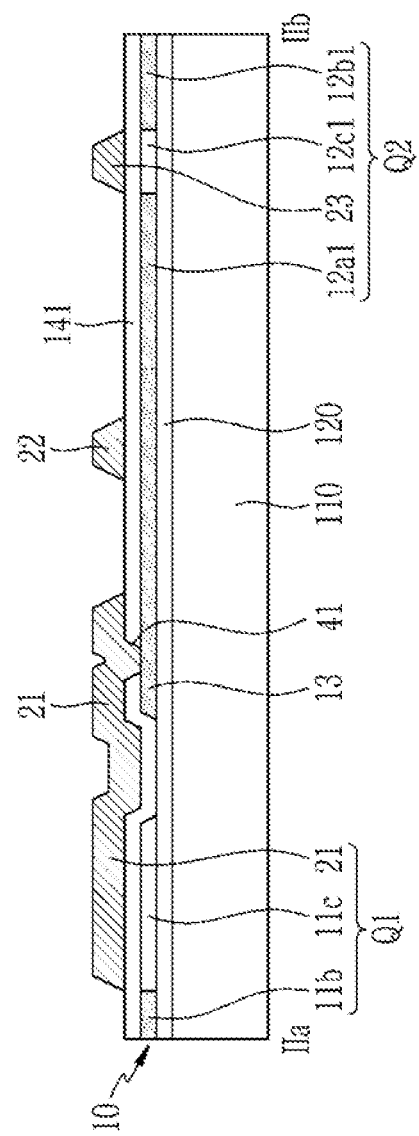
FIG. 2 is a cross-sectional view taken along a line IIa-IIb of the display device illustrated in FIG. 1.

FIG. 1 is a layout view illustrating a portion of a display device according to an exemplary embodiment of the present invention. FIG. 2 is a cross-sectional view taken along a line IIa-IIb of the display device illustrated in FIG. 1.

Referring to FIG. 1 and FIG. 2, a display device according to an exemplary embodiment of the present invention will be described in more detail below.

Referring to FIG. 1 and FIG. 2, a display device according to an exemplary embodiment of the present invention may include a substrate, such as an insulating substrate 110.

A buffer layer 120 including an inorganic insulating material such as a silicon nitride (SiNx) or a silicon oxide (SiOx) and/or an organic insulating material may be disposed on the substrate 110. At least a portion of the buffer layer 120 may be omitted, and thus at least a portion of the insulating substrate 110 (e.g., an upper surface of the insulating substrate 110 might not be covered by the buffer layer 120.

An active layer 10 including a semiconductor material such as polycrystalline silicon, or an oxide semiconductor may be disposed on the buffer layer 120. The active layer 10 may include channel regions 11c, 12c1, and 12c2 for forming channels of transistors as semiconductors, and conductive regions 11a, 11b, 12a1, 12a2, 12b1, 12b2, and 13. The conductive regions 11a, 11b, 12a1, 12a2, 12b1, 12b2, and 13 of the active layer 10 may have a higher carrier concentration than the channel regions 11c, 12c1, and 12c2.

The conductive regions 11a and 11b may be positioned on opposite sides of the channel region 11c with the channel region 11c positioned between the conductive regions 11a and 11b. The conductive regions 12a1 and 12b1 may be positioned on opposite sides of the channel region 12c1 with the channel region 12c1 positioned between the conductive regions 12a1 and 12b1. The conductive regions 12a2 and 12b2 may be positioned on opposite sides of the channel region 12c2 with the channel region 12c2 positioned between the conductive regions 12a2 and 12b2.

The conductive region 13 may be positioned between the conductive region 12a2 and the conductive region 12a1, and a first end and a second end of the conductive region 13 may be connected with the conductive region 12a2 and the conductive region 12a1, respectively. The conductive region 12a2 and the conductive region 12a1 may be connected with the conductive region 13 to form one continuous conductive region such that the conductive region 12a2 and the conductive region 12a1 may be included in the conductive region 13. The conductive region 13 may be directly connected with the channel region 12c1 and the channel region 12c2.

A first insulating layer 141 may be disposed on the active layer 10. The first insulating layer 141 may include an inorganic insulating material such as a silicon nitride and a silicon oxide and/or an organic insulating material. The first insulating layer 141 may include a contact hole 41 formed above the conductive region 13.

A conductive layer including gate conductors 21, 22, and 23 that are separated from each other may be disposed on the first insulating layer 141. A portion of the active layer 10 overlapping the gate conductor 21 may be the channel region 11c, a portion of the active layer 10 overlapping the gate conductor 22 may be the channel region 12c2, and a portion of the active layer 10 overlapping the gate conductor 23 may be the channel region 12c1.

The channel regions 11c and the conductive regions 11a and 11b connected to each other may form a transistor Q1 together with the gate conductor 21. The conductive regions 11a and 11b on opposite sides of the channel region 11c may respectively serve as a source region and a drain region of the transistor Q1. The conductive regions 12a1 and 12b1 connected to each other may form a transistor Q2 together with the gate conductor 23. The conductive regions 12a1 and 12b1 on opposite sides of the channel region 12c1 may respectively serve as a source region and a drain region of the transistor Q1. The conductive regions 12a2 and 12b2 connected to each other may form a transistor Q3 together with the gate conductor 22. The conductive regions 12a2 and 12b2 on opposite sides of the channel region 12c2 may respectively serve as a source region and a drain region of the transistor Q3.

The conductive region 13 may include a portion overlapping the gate conductor 21 along a direction orthogonal to an upper surface of the insulating substrate 110, and a portion not overlapping the gate conductor 21 along the direction orthogonal to the upper surface of the insulating substrate 110. The active layer 10 overlying the conductive layer including the gate conductors 21, 22 and 23 may also include the conductive region 13 in addition to the channel region. The gate conductor 21 may be electrically connected to the conductive region 13 of the active layer 10 through the contact hole 41 of the first insulating layer 141.

The gate conductor 21 of the transistor Q1 and the source region or the drain region of the transistor Q2 may be electrically connected, as desired. Another gate conductor 22 may be positioned between the gate conductor 21 and the source or drain region of the transistor Q2 that are spaced apart from each other, and thus it is possible to connect the source region or the drain region of the transistor Q2 with the gate conductor 21 by using another conductor, which is disposed on the gate conductors 21, 22, and 23, as a bridge.

However, in an exemplary embodiment of the present invention, it is possible to electrically connect the gate conductor 21 and the source region or the drain region of the transistor Q2 through the conductive region 13 which is a portion of the active layer 10. Thus, an additional conductor of another layer may be omitted and thus the connection structure is simplified, and side effect such as a parasitic capacitance caused by additional layers may be reduced or eliminated.

Thus, the conductive region 13 of the active layer 10 may function as a conductive connector for connecting the gate conductor 21 and the source or drain region of the transistor Q2. A portion of the conductive region 13 may overlap the gate conductors 21 and 22 along the direction orthogonal to the upper surface of the insulating substrate 110, and thus another channel region may be formed. However, in an exemplary embodiment of the present invention, the conductive region 13 has conductivity either with or without overlapping the gate conductors 21 and 22. Thus, an additional doping process for forming the conductive region 13 may be added before the doping process for forming a plurality of conductive regions 11a, 11b, 12a1, 12a2, 12b1, and 12b2 of the active layer 10 in the manufacturing process of the display device according to an exemplary embodiment of the present invention.

In an exemplary embodiment of the present invention (see, e.g., FIG. 1), at least one component of the transistor Q2 and the transistor Q3, the gate conductors 22 and 23, and the channel region 11c and the conductive regions 11a and 11b in the active layer 10 may be omitted. For example, according to an exemplary embodiment of the present invention, a display device may include only the gate conductor 21 and the active layer 10. As an example, a structure in which the active layer 10 positioned between the gate conductor 21 and the substrate 110 forms the conductive region 13 instead of the channel region to function as a bridge for electrically connecting the gate conductor 21 with another conductive region 12a1 of the active layer 10 is possible.

A display device according to an exemplary embodiment of the present invention will be described with reference to FIG. 3 and FIG. 4 below.

Figure 3:
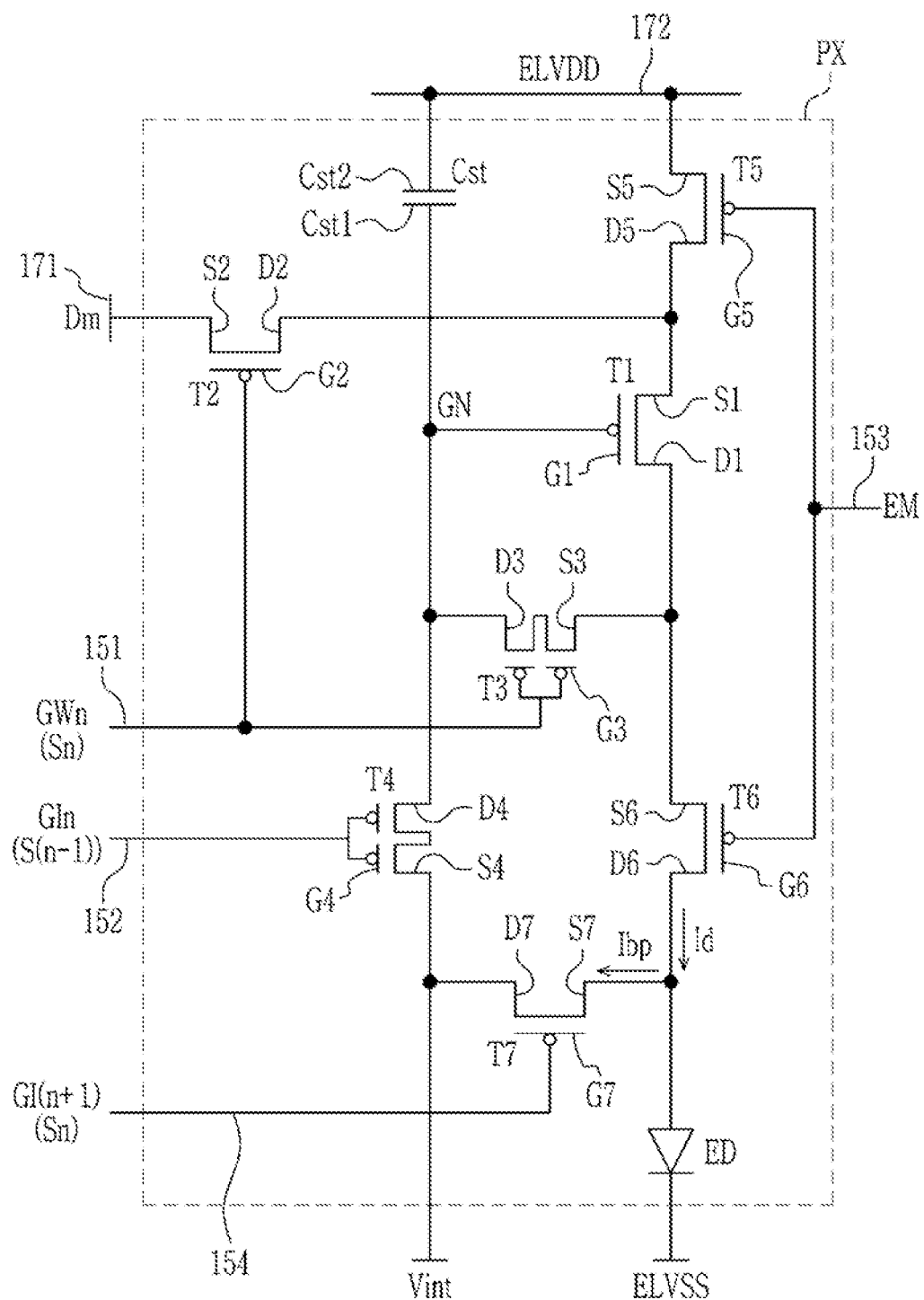
FIG. 3 is a circuit diagram illustrating a pixel of a display device according to an exemplary embodiment of the present invention.

FIG. 3 is a circuit diagram illustrating a pixel of a display device according to an exemplary embodiment of the present invention. FIG. 4 is a timing diagram of signals applied to a display device according to an exemplary embodiment of the present invention.

Referring to FIG. 3, a display device according to an exemplary embodiment of the present invention may include a plurality of pixels PX for displaying images, and a plurality of signal lines 151, 152, 153, 154, 171, and 172. One pixel PX may include a plurality of transistors T1, T2, T3, T4, T5, T6, and T7, a capacitor Cst, and at least one light emitting diode ED, connected with the signal lines 151, 152, 154, 153, 171, and 172.

In an exemplary embodiment of the present invention, one pixel PX may include one light emitting diode ED.

The signal lines 151, 152, 154, 153, 171, and 172 may include a plurality of scan lines 151, 152, and 154, a plurality of control lines 153, a plurality of data lines 171, and a plurality of driving voltage lines 172.

The scan lines 151, 152, and 154 may respectively transfer scan signals GWn, GIn, and GI(n+1). The scan signals GWn, Gin, and GI(n+1) may include a gate-on voltage and a gate-off voltage for turning the transistors T2, T3, T4, and T7 included in the pixel PX on and off.

The scan lines 151, 152, and 154 connected with one pixel PX may include a first scan line 151 for transferring a scan signal GWn, a second scan line 152 for transferring a scan signal Gin having the gate-on voltage at a different time from that of the first scan line 151, and a third scan line 154 for transferring a scan signal GI(n+1). In an exemplary embodiment of the present invention, an example in which the second scan line 152 transmits the gate-on voltage at an earlier time than the first scan line 151 will be mainly described. For example, when the scan signal GWn is the $n^{th}$ scan signal Sn (n is a natural number of 1 or more) among scan signals applied during one frame, the scan signal Gin may be a previous scan signal such as an $(n-1)^{th}$ scan signal $S(n-1)$, and the scan signal GI(n+1) may be an $n^{th}$ scan signal Sn. However, exemplary embodiments of the present invention are not limited thereto, and the scan signal GI(n+1) may be a scan signal other than the $n^{th}$ scan signal Sn.

The control line 153 may transmit a control signal, and for example, may transmit a light emitting control signal controlling light emitting of the light emitting diode ED included in the pixel PX. The control signal transferred by the control line 153 may transmit the gate-on voltage and the gate-off voltage, and may have a different waveform from the scan signal transmitted by the scan lines 151, 152, and 154.

The data line 171 may transmit a data signal Dm, and the driving voltage line 172 may transmit a driving voltage ELVDD. The data signal Dm may have different voltage levels depending on the image signal input to the display device, and the driving voltage ELVDD may have a substantially constant level.

The display device according to an exemplary embodiment of the present invention may further include a driver transmitting signals to each of the plurality of signal lines 151, 152, 153, 154, 171, and 172.

As an example, the transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gin to the fourth transistor T4, the third scan line 154 may transmit the scan signal GI(n+1) to the seventh transistor T7, and the control line 153 may transmit a light emitting control signal EM to the fifth transistor T5 and the sixth transistor T6.

A gate electrode G1 of the first transistor T1 may be connected to one terminal Cst1 of the capacitor Cst through a driving gate node GN, a source electrode S1 of the first transistor T1 may be connected to the driving voltage line 172 through the fifth transistor T5, and a drain electrode D1 of the first transistor T1 may be electrically connected to an anode of the light emitting diode ED via the sixth transistor T6. The first transistor T1 may receive a data signal Dm transmitted by the data line 171 depending on a switching operation of the second transistor T2 to supply a driving current Id to the light emitting diode ED.

A gate electrode G2 of the second transistor T2 may be connected to the first scan line 151, a source electrode S2 of the second transistor T2 may be connected to the data line 171, and a drain electrode D2 of the second transistor T2 may be connected to the source electrode S1 of the first transistor T1 and to the driving voltage line 172 via the fifth transistor T5. The second transistor T2 may be turned on depending on the scan signal GWn transmitted through the first scan line 151 such that the data signal Dm transmitted from the data line 171 may be transmitted to the source electrode S1 of the first transistor T1.

A gate electrode G3 of the third transistor T3 may be connected to the first scan line 151, and a source electrode S3 of the third transistor T3 may be connected to the drain electrode D1 of the first transistor T1 and to the anode of the organic light emitting diode OLED via the sixth transistor T6. A drain electrode D3 of the third transistor T3 may be connected to each of a drain electrode D4 of the fourth transistor T4, one terminal Cst1 of the capacitor Cst, and the gate electrode G1 of the first transistor T1. The third transistor T3 may be turned on depending on the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 may be connected to the second scan line 152, a source electrode S4 of the fourth transistor T4 may be connected to an initialization voltage Vint, and a drain electrode D4 of the fourth transistor T4 may be connected to one terminal Cst1 of the capacitor Cst and the gate electrode G1 of the first transistor T1 through the drain electrode D3 of the third transistor T3. The fourth transistor T4 may be turned on depending on the previous scan signal Gin transmitted through the previous scan line 152 to transmit the initialization voltage Vint to the gate electrode G1 of the first transistor T1, thus performing an initialization operation of initializing the voltage of the gate electrode G1 of the first transistor T1.

A gate electrode G5 of the fifth transistor T5 may be connected to the control line 153, a source electrode S5 of the fifth transistor T5 may be connected to the driving voltage line 172, and a drain electrode D5 of the fifth transistor T5 may be connected to the source electrode S1 of the first transistor T1 and the drain electrode D2 of the second transistor T12.

A gate electrode G6 of the sixth transistor T6 may be connected to the control line 153, a source electrode S6 of the sixth transistor T6 may be connected to the drain electrode D1 of the first transistor T1 and the source electrode S3 of the third transistor T3, and a drain electrode D6 of the sixth transistor T6 may be electrically connected to the anode of the organic light emitting diode ED. The fifth transistor T5 and the sixth transistor T6 may be substantially simultaneously turned on depending on the light emitting control signal EM transmitted through the control line 153, and thus the driving voltage ELVDD may be compensated by the diode-connected driving transistor T1 and then may be transmitted to the light emitting diode ED.

A gate electrode G7 of the seventh transistor T7 may be connected to the third scan line 154, a source electrode S7 of the seventh transistor T7 may be connected to the drain electrode D6 of the sixth transistor T6 and the anode of the light emitting diode (LED) ED, and a drain electrode D7 of the seventh transistor T7 may be connected to the terminal of the initialization voltage Vint and the source electrode S4 of the fourth transistor T4.

The transistors T1, T T3, T4, T5, T6, and T7 may be P-type channel transistors such as a PMOS, however exemplary embodiments of the present invention are not limited thereto, and at least one among the transistors T1, T2, T3, T4, T5, T6, and T7 may be an N-type channel transistor.

One terminal Cst1 of the capacitor Cst may be connected to the gate electrode G1 of the first transistor T1 as described above, and another terminal Cst2 thereof may be connected to the driving voltage line 172. A cathode of the light emitting diode (LED) ED may be connected to a common voltage ELVSS terminal transmitting a common voltage ELVSS to receive the common voltage ELVSS.

The structure of the pixel PX according to an exemplary embodiment of the present invention is not limited to the structure described with reference to FIG. 1, and a number of transistors and a number of capacitors that are included in one pixel PX and a connection relationship thereof may be variously modified, as desired.

A driving method of the display device according to an exemplary embodiment of the present invention will be described in more detail below with reference to FIG. 4 along with FIG. 3. An example in which the transistors T1, T2, T3, T4, T5, T6, and T7 are P-type channel transistors, and an operation of one frame will be described in more detail below; however, exemplary embodiments of the present invention are not limited thereto.

Figure 4:
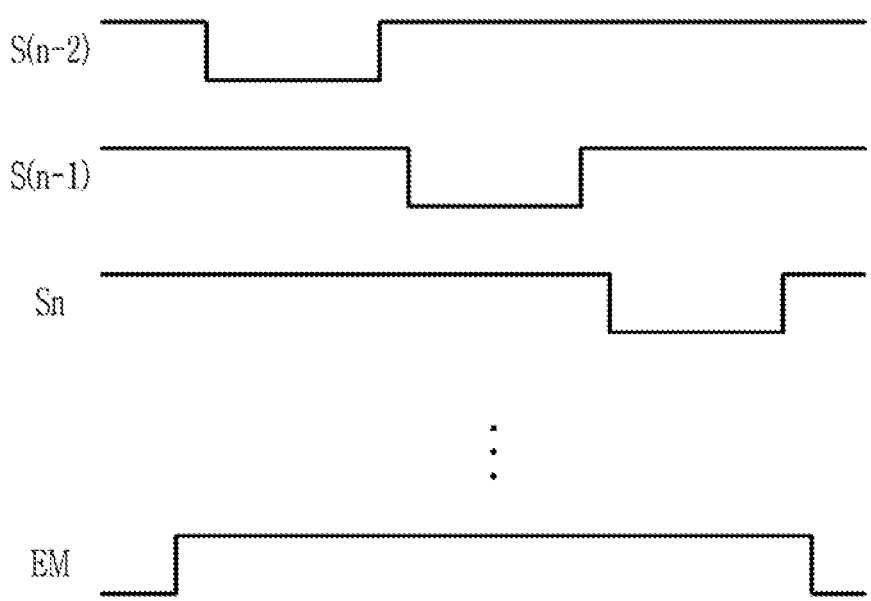
FIG. 4 is a timing diagram of signals applied to a display device according to an exemplary embodiment of the present invention.

Referring to FIG. 4, in one frame, scan signals . . . , S(n−2), S(n−1), Sn, . . . of a low level may be sequentially applied to the plurality of first scan lines 151 connected to the pixels PX.

When a scan signal Gin of a low level is supplied through the second scan line 152 for an initialization period, the fourth transistor T4 is turned on, the initialization voltage Vint is connected to the gate electrode G1 of the first transistor T1 through the fourth transistor T4, and the driving transistor T1 is initialized by the initialization voltage Vint. In this case, the scan signal Gin may be an $(n-1)^{th}$ scan signal S(n−1).

Subsequently, when the scan signal GWn of the low level is supplied through the first scan line 151 during a data programming and compensation period, the second transistor T2 and the third transistor T3 are turned on in response to the scan signal GWn of the low level. In this case, the scan signal GWn may be an ($n^{th}$) scan signal Sn. The first transistor T1 is diode-connected by the turned-on third transistor T3 and is biased in a forward direction. Thus, a compensation voltage (Dm+Vth, Vth is a negative value) decreased by a threshold voltage Vth of the first transistor T1 from the data signal Dm supplied from the data line 171 is applied to the gate electrode G1 of the first transistor T1. The driving voltage ELVDD and the compensation voltage (Dm+Vth) may be respectively applied to both terminals of the capacitor Cst, and the capacitor Cst may be charged with a charge corresponding to a voltage difference of both terminals.

The light emitting control signal EM supplied from the control line 153 is changed from the high level to the low level during a light emitting period. A time when the light emitting control signal EM is changed from the high level to the low level may be after the scan signal GWn is applied to all first scan lines 151 in one frame. Thus, during the light emitting period, the fifth transistor T5 and the sixth transistor T6 are turned on by the light emitting control signal EM of the low level, a driving current Id is generated according to the voltage difference between the gate voltage of the gate electrode G1 of the first transistor T1 and the driving voltage ELVDD, and the driving current Id is supplied to the light emitting diode ED through the sixth transistor T6, thereby a current Ied flows to the light emitting diode ED.

As an example, during an initialization period, the seventh transistor T7 may receive the scan signal GI(n+1) of the low level through the third scan line 154 to be turned on. The scan signal GI(n+1) may be an $n^{th}$ scan signal Sn. A part of the driving current id may flow out through the seventh transistor T7 as a bypass current Ibp by the turned-on seventh transistor T7.

A display device according to an exemplary embodiment of the present invention will be described in more detail below with reference to FIG. 5 to FIG. 7 along with the aforementioned accompanying drawings. For clarity of description, a plane structure of the display device according to an exemplary embodiment of the present invention is firstly described and then a cross-sectional structure is described.

Figure 5:
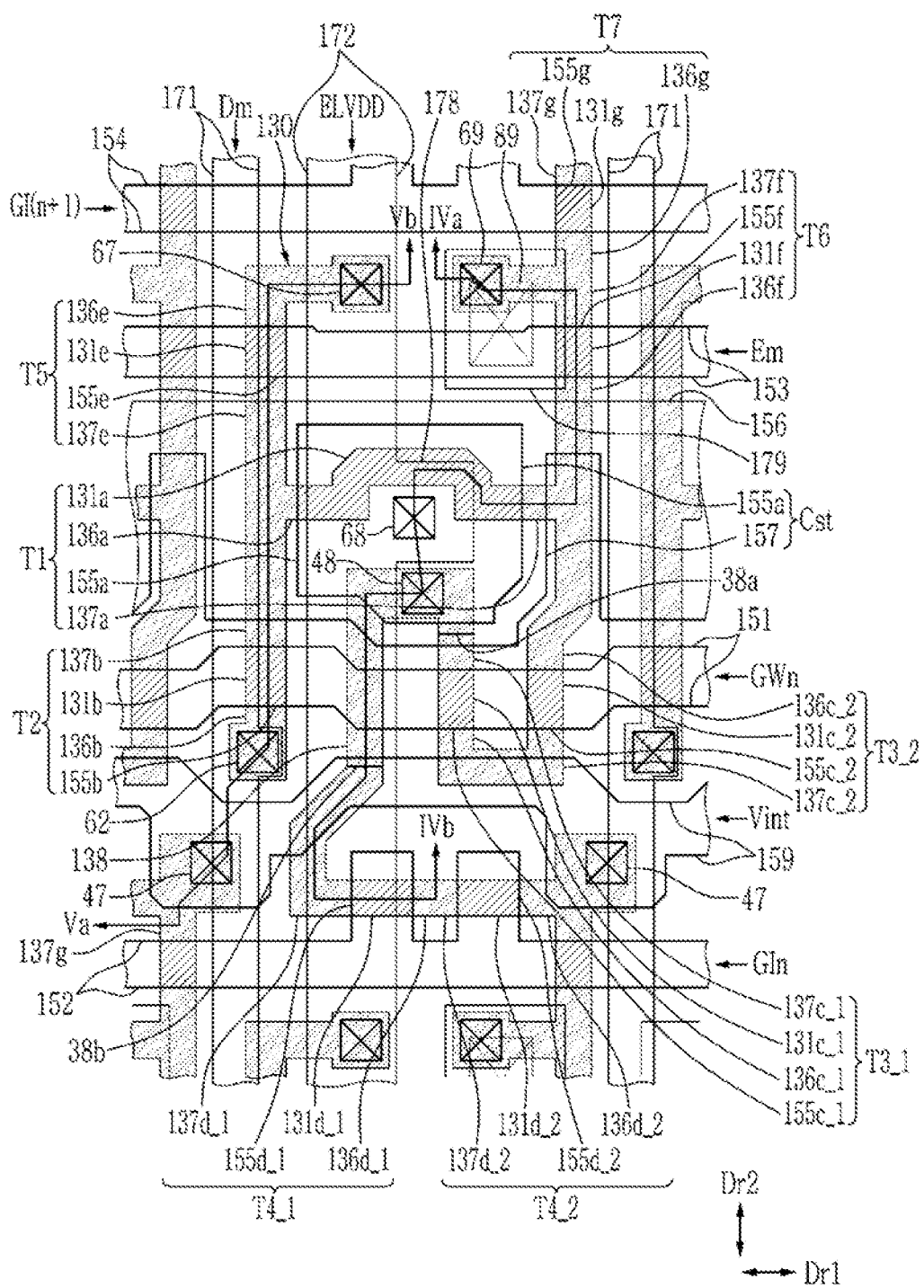
FIG. 5 is a layout view illustrating a pixel of a display device according to an exemplary embodiment of the present invention.

FIG. 5 is a layout view illustrating a pixel of a display device according to an exemplary embodiment of the present invention. FIG. 6 is a cross-sectional view taken along a line IVa-IVb of the pixel of the display device illustrated in FIG. 5. FIG. 7 is a cross-sectional view taken along a line Va-Vb of the pixel of the display device illustrated in FIG. 5.

Referring to FIG. 5, one pixel of the display device according to an exemplary embodiment of the present invention may include the plurality of transistors T1, T2, T3, T4, T5, T6, and T7 and the capacitor Cst that are each connected with at least one of the plurality of scan lines 151, 152, and 154, the control line 153, the data line 171 and the driving voltage line 172.

The scan lines 151, 152, and 154 and the control line 153 may extend in substantially a same direction in a plan view (e.g., a first direction Dr1). The first scan line 151 may be positioned between the second scan line 152 and the control line 153 in the plan view. When viewing overall of the display device, the third scan line 154 which may be substantially the same as the second scan line 152, may transfer a next scan signal GI(n+1) after the scan signal GIn transmitted by the second scan line 152.

The data line 171 and the driving voltage line 172 may extend substantially in a second direction Dr2 perpendicular to the first direction Dr1 in the plan view, and may cross the scan lines 151, 152, and 154 and the control line 153. The data line 171 may transfer a data signal Dm, and the driving voltage line 172 may transfer a driving voltage ELVDD. The driving voltage line 172 may include an expansion 178. For example, the driving voltage line 172 may include the expansion 178 in each pixel.

The display device according to an exemplary embodiment of the present invention may further include a storage line 156, and an initialization voltage line 159. The storage line 156 and the initialization voltage line 159 may extend substantially in the first direction Dr1 in the plan view. The storage line 156 may be positioned between the first scan line 151 and the control line 153 in the plan view, and may include an expansion 157. The expansion 157 may be included in each pixel. The expansion 157 of the storage line 156 may be connected with the expansion 178 of the driving voltage line 172 to receive a driving voltage ELVDD. The initialization voltage line 159 may be positioned between the first scan line 151 and the second scan line 152 in the plan view to transfer an initialization voltage Vint, but a position of the initialization voltage line 159 is not limited thereto.

The scan lines 151, 152, and 154 and the control line 153 may be included in the first conductive layer, may be disposed in a same layer in the sectional view, and may include a same material as each other. The storage line 156 and the initialization voltage line 159 may be included in the second conductive layer that is different from the first conductive layers, may be disposed in a same layer in the plan view, and may include a same material as each other. For example, the second conductive layer may be disposed on a layer above the first conductive layer. The data line 171 and the driving voltage line 172 may be included in a third conductive layer that is different from the first and second conductive layers, may be disposed in a same layer in the plan view, and may include a same material as each other. For example, the third conductive layer may be disposed on a layer above the second conductive layer.

Each channel of the transistors T1, T2, T3, T4, T5, T6, and T7 may be formed in one active pattern 130, and the active pattern 130 may be bent in various shapes. The active pattern 130 may include a semiconductor material such as amorphous/polycrystalline silicon or an oxide semiconductor.

The active pattern 130 may include a channel region which is semiconductive, and a conductive region. The channel region may include at least one of channel regions 131a, 131b, 131c_1, 131c_2, 131d_1, 131d_2, 131e, 131f, and 131g in which channels of transistors T1, T2, T3_1, T3_2, T4_1, T4_2, T5, T6, and T7 are formed. Other regions than the channel regions 131a, 131b, 131c_1, 131c_2, 131d_1, 131d_2, 131e, 131f, and 131g may be conductive regions in the active pattern 130. The conductive regions have a higher carrier concentration than that of the channel regions 131a, 131b, 131c1, 131c_2, 131d_1, 131d_2, 131e, 131f, and 131g. The conductive regions may be positioned between opposite ends of the respective channel regions 131a, 131b, 131c_1, 131c_2, 131d_1, 131d_2, 131e, 131f, and 131g to include regions serving as source regions and drain regions of the corresponding transistors T1, T2, T3_1, T3_2, T4_1, T4_2, T5, T6, and T7 and connectors 138.

The first transistor T1 may include a channel region 131a, a source region 136a and a drain region 137a which serve as conductive regions of the active patterns 130 positioned at opposite sides of the channel region 131a, and a driving gate electrode 155a which overlaps the channel region 131a in the plan view.

The channel region 131a of the first transistor T1 may be bent at least once. For example, the channel region 131a may have a meandering shape or a zigzag shape. FIG. 5 illustrates an example in which the channel region 131a is substantially vertically inverted; however, exemplary embodiments of the present invention are not limited thereto.

The driving gate electrode 155a may be included in the first conductive layer, and may be connected with the connector 138 in the conductive regions of the active pattern 130 through a contact hole 48. The connector 138 may extend substantially in the second direction Dr2 to cross the first scan line 151. The connector 138 may be in a position corresponding to a driving gate node GN (see, e.g., FIG. 3) along with the driving gate electrode 155a.

The second transistor T2 may include the channel region 131b, a source region 136b and a drain region 137b which serve as conductive regions of the active pattern 130 positioned at opposite sides of the channel region 131b, and a gate electrode 155b which overlaps the channel region 131b in the plan view. The gate electrode 155b is a portion of the first scan line 151. The source region 136b may be connected with the data line 171 through a contact hole 62, and the drain region 137b is connected with the source region 136a of the first transistor T1.

The third transistor T3 illustrated in FIG. 3 may include two parts for preventing a leakage current. As an example, the third transistor T3 may include a first portion T3_1 of the third transistor T3 and a third transistor second portion T3_2 which are adjacent to each other and connected to each other.

The first portion T3_1 of the third transistor T3 may include the channel region 131c_1 which overlaps the first scan line 151 in the plan view, a source region 136c_1 and a drain region 137c_1 which are conductive regions of the active pattern 130 positioned at opposite ends of the channel region 131c_1, and a gate electrode 155c_1 which overlaps the channel region 131c_1. The drain region 137c_1 may be connected with the driving gate electrode 155a through the connector 138.

The third transistor second portion T3_2 may include the channel region 131c_2 which overlaps the first scan line 151 in the plan view, a source region 136c_2 and a drain region 137c_2 which are conductive regions of the active pattern 130 positioned at opposite ends of the channel region 131c_2, and a gate electrode 155c_2 which overlaps the channel region 131c_2. The gate electrode 155c_2 is a portion of the first scan line 151. The source region 136c_2 of the third transistor second portion T3_2 is connected with the drain region 137a of the first transistor T1, and the drain region 137c_2 is connected with the source region 136c_1 of the first portion T3_1 of the third transistor T3.

The fourth transistor T4 (see, e.g., FIG. 3) may also include two parts for preventing a leakage current. As an example, the fourth transistor T4 may include a first portion T4_1 of the fourth transistor T4 and a fourth transistor second portion T4_2 which are adjacent to each other and connected to each other.

A first portion T4_1 of the fourth transistor T4 may include the channel region 131d_1 which overlaps the second scan line 152 in the plan view, a source region 136d_1 and a drain region 137d_1 which are conductive regions of the active pattern 130 positioned at opposite ends of the channel region 131d_1, and a gate electrode 155d_1 which overlaps the channel region 131d_1. The gate electrode 155d_1 may be a portion of a protruded part of the second scan line 152. The drain region 137d_1 is connected with the drain region 137c_1 of the first portion T3_1 of the third transistor T3 and the driving gate electrode 155a through the connector 138.

A second portion T4_2 of the fourth transistor T4 may include the channel region 131d_2 which overlaps the second scan line 152 in the plan view, a source region 136d_2 and a drain region 137d_2 which are conductive regions of the active pattern 130 positioned at opposite ends of the channel region 131d_2, and a gate electrode 155d_2 which overlaps the channel region 131d_2. The gate electrode 155d_2 may be a portion of a protruded part of the second scan line 152. The drain region 137d_2 is connected with the source region 136d_1 of the first portion T4_1 of the fourth transistor T4, and the source region 136d_2 is connected with the initialization voltage line 159 through a contact hole 47.

The fifth transistor T5 may include the channel region 131e, a source region 136e and a drain region 137e which are conductive regions of the active pattern 130 positioned at opposite ends of the channel region 131e, and a gate electrode 155e which overlaps the channel region 131e. The gate electrode 155e is a portion of the control line 153. The source region 136e is connected with the driving voltage line 172 through a contact hole 67, and the drain region 137e is connected with the source region 136a of the first transistor T1.

The sixth transistor T6 may include the channel region 131f, a source region 136f and a drain region 137f which are conductive regions of the active pattern 130 positioned at opposite ends of the channel region 131f, and a gate electrode 155f which overlaps the channel region 131f. The gate electrode 155f is a portion of the control line 153. The source region 136f is connected with the drain region 137a of the first transistor T1, and the drain region 137f is connected with a connecting member 179 through a contact hole 69. The connecting member 179 may be included in the third conductive layer in the plan view.

The seventh transistor T7 may include the channel region 131g, a source region 136g and a drain region 137g which are conductive regions of the active pattern 130 positioned at opposite ends of the channel region 131g, and a gate electrode 155g which overlaps the channel region 131g. The gate electrode 155g is a portion of the third scan line 154. The source region 136g is connected with the drain region 137f of the sixth transistor T6, and the drain region 137g is connected with the initialization voltage line 159 through the contact hole 47 to receive the initialization voltage Vint.

The capacitor Cst may include the driving gate electrode 155a and the expansion 157 of the storage line 156 which overlap each other in the plan view as two terminals. The capacitor Cst may maintain a voltage difference between the driving gate electrode 155a and the expansion 157 of the storage line 156 which receives the driving voltage ELVDD. The expansion 157 of the storage line 156 may have a wider area in the plan view than the driving gate electrode 155a to cover an entire area of the corresponding driving gate electrode 155a.

The connector 138 may have a first end 38a connected with the drain region 137c_1 of the first portion T3_1 of the third transistor T3 and a second end 38b connected with the drain region 137d_1 of the first portion T4_1 of the fourth transistor T4. Thus, the connector 138 may form one continuous conductive region together with the drain region 137c_1 of the first portion T3_1 of the third transistor T3 and the drain region 137d_1 of the first portion T4_1 of the fourth transistor T4. Since the active patterns 130 positioned between opposite sides with respect to each of the first end 38a and the second end 38b are all conductive regions, the first end 38a and the second end 38b might not form a boundary. However, the active patterns 130 may be positioned between opposite sides with respect to each of the first end 38a and the second end 38b may have different carrier concentrations.

The first end 38a of the connector 138 may be located at different positions, which range from a lower outer boundary of the driving gate electrode 155a to a boundary between the channel region 131c_1 and the drain region 137c_1 of the first portion T3_1 of the third transistor T3. When the first end 38a is positioned at the boundary between the channel region 131c_1 and the drain region 137c_1 of the first portion T3_1 of the third transistor T3, the connector 138 may serve as a drain region of the first portion T3_1 of the third transistor T3.

Similarly, the second end 38b of the connector 138 may be located at different positions, which range from a lower outer boundary of the first scan line 151 to a boundary between the channel region 131d_1 and the drain region 137d_1 of the first portion T4_1 of the fourth transistor T4. When the second end 38b is positioned at the boundary between the channel region 131*d*_1 and the drain region 137*d*_1 of the first portion T4_1 of the fourth transistor T4, the connector 138 may serve as a drain region of the first portion T4.1 of the fourth transistor T4.

The active pattern 130 which overlaps the driving gate electrode 155*a* may include the channel region 131*a* and the connector 138, and regions other than the channel region 131*a* in the active pattern 130 overlapping the driving gate electrode 155*a* may all be conductive regions.

Thus, according to an exemplary embodiment of the present invention, in the active pattern 130, a region of the active pattern 130 which overlaps with the first conductive layer may be mostly a channel region that is a semiconductor, but may also include a conductive region. The conductive region may be used as a connector for connecting two conductors (e.g., the driving gate electrode 155*a* and the drain region 137*d*_1) which are separated from each other and are positioned in different layers.

A cross-section of the display device according to an exemplary embodiment of the present invention will be described in more detail below with reference to FIG. 6 and FIG. 7 along with FIG. 5.

The display device according to an exemplary embodiment of the present invention may include the substrate 110. The substrate 110 may include an inorganic insulating material such as glass or an organic insulating material such as plastic such as polyimide (PI), and may have varying degrees of flexibility.

The buffer layer 120 may be disposed on the substrate 110. The buffer layer 120 may block the transfer of impurities from the substrate 110 to an upper layer of the buffer layer 120, for example to the active pattern 130, thus reducing or eliminating deterioration of the active pattern 130 and relieving stress. The buffer layer 120 may include an inorganic or organic insulating material such as a silicon nitride or a silicon oxide. A portion or all of the buffer layer 120 may be omitted.

The active pattern 130 may be disposed on the buffer layer 120, and the first insulating layer 141 may be disposed on the active pattern 130.

A first conductive layer including the scan lines 151, 152, and 154, the control line 153, and the driving gate electrode 155*a* may be disposed on the first insulating layer 141.

A second insulating layer 142 may be disposed on the first conductive layer and the first insulating layer 141, and a second conductive layer including the storage line 156, and the initialization voltage line 159 may be disposed on the second insulating layer 142. The expansion 157 of the storage line 156 may overlap the driving gate electrode 155*a* along the direction orthogonal to the upper surface of the insulating substrate 110 with the second insulating layer 142 therebetween to form a capacitor Cst.

A third insulating layer 160 may be disposed on the second conductive layer and the second insulating layer 142.

At least one of the first insulating layer 141, the second insulating layer 142, and the third insulating layer 160 may include an inorganic insulating material such as a silicon nitride or a silicon oxide, and/or an organic insulating material.

The first insulating layer 141 may include a contact hole 48 positioned above the connector 138 of the active pattern 130. The first and second insulating layers 141 and 142 may include a contact hole 47 positioned above the drain region 137*g* of the seventh transistor T7. The first, second, and third insulating layers 141, 142, and 160 may include a contact hole 62 positioned above the source region 136*b* of the second transistor T2. A contact hole 67 may be positioned above the source region 136*e* of the fifth transistor T5, and a contact hole 69 may be positioned above the drain region 137*f* of the sixth transistor T6. The third insulating layer 160 may include a contact hole 68 positioned above the expansion 157 of the storage line 156.

The third conductive layer including the data line 171, the driving voltage line 172, and the connecting member 179 may be disposed on the third insulating layer 160.

At least one of the first conductive layer, the second conductive layer, and the third conductive layer may include a conductive material such as a metal, e.g., copper (Cu), aluminum (Al), molybdenum (Mo), titanium (Ti), tantalum (Ta), or an alloy of at least two thereof.

A passivation layer 180 may be disposed on the third conductive layer and the third insulating layer 160. The passivation layer 180 may include an organic insulating material such as a polyacryl-based resin or a polyimide-based resin, and a top surface of the passivation layer 180 may be substantially flat. The passivation layer 180 may have a contact hole 89 formed in the connecting member 179.

A fourth conductive layer including a plurality of pixel electrodes 191 may be disposed on the passivation layer 180. Each of the pixel electrodes 191 may be connected with the connecting member 179 through the contact hole 89 to receive a voltage. The pixel electrodes 191 may be arranged in a pentile matrix structure.

A pixel definition layer (PDL) 350 may be disposed on the passivation layer 180 and the pixel electrode 191. The pixel definition layer 350 may include an opening 351 in each of the pixel electrodes 191.

An emission layer 370 may be disposed on the pixel electrodes 191. The emission layer 370 may be positioned in the opening 351. The emission layer 370 may include an organic light emitting material or an inorganic light emitting material.

A common electrode 270 may be disposed on the emission layer 370. The common electrode 270 may also be formed on the pixel definition layer 350 to extend over a plurality of pixels.

The pixel electrode 191, the emission layer 370, and the common electrode 270 together may form a light emitting diode ED.

An encapsulation layer protecting the light emitting diode ED may be disposed on the common electrode 270. The encapsulation layer may include an inorganic layer and an organic layer which are alternately stacked.

According to an exemplary embodiment of the present invention, a connecting member may electrically connect the driving gate electrode 155*a* of the first transistor T1 with the conductive region of the active pattern 130 (e.g., the drain region 137*d*_1 of the first portion T4_1 of the fourth transistor) which are spaced apart from each other. A conductor may be positioned between the driving gate electrode 155*a* and the drain region 137*d*_1 of the first portion T4_1 of the fourth transistor T4, such as the first scan line 151. The connecting member may cross the conductor and is insulated from to conductor. Thus, the connecting member connecting the driving gate electrode 155*a* with the drain region 137*d*_1 of the first portion T4_1 of the fourth transistor T4 may be positioned in a conductive layer disposed on the driving gate electrode 155*a*. The driving gate electrode 155*a* overlaps the expansion 157 of the storage line 156 to form a capacitor Cst, and thus the connecting member is mainly disposed in a third conductive layer which is disposed at a different layer from that of the storage line 156. Thus, the connecting member is connected to the driving gate electrode 155a through an opening formed in the expansion 157 of the storage line 156.

Thus, an area of the expansion 157 may be reduced and the capacitance of the capacitor Cst may be reduced accordingly and the maintaining ability of the voltage of the driving gate electrode 155a may be reduced. Further, a margin capable of reducing a pixel size may be reduced by an opening that is formed in the expansion 157, and thus it may be difficult to manufacture a high-resolution display device. In addition, since the connecting member for connecting the driving gate electrode 155a with the drain region 137d_1 of the first portion T4_1 of the fourth transistor T4 is disposed in the third conductive layer, a coupling capacitor may be generated between the connecting member and the fourth conductive layer such as the pixel electrode 191 thereabove. In this case, color deviation may occur when deviation of the coupling capacitor occurs based on pixels. In addition, the connecting member disposed in the third conductive layer may be relatively close to another third conductive layer such as the data line 171, and thus a capacitance of the coupling capacitor between the driving gate node GN and the adjacent data line 171 may become relatively large. Thus, a voltage of the driving gate electrode 155a may be changed depending on a change of the data signal Dm, thus generating crosstalk, or signal contamination.

According to an exemplary embodiment of the present invention, the connector 138 which is a portion of the active pattern 130 may connect the driving gate electrode 155a with the drain region 137d_1 of the first portion T4_1 of the fourth transistor. Thus, a connecting member in the third conductive layer may be omitted, without an occurrence of side effects. Thus, sufficient capacitance of the capacitor Cst can be achieved, a high-resolution display device can be realized, and the generation of color defects and image quality defects such as crosstalk can be reduced or eliminated.

The source region 136d_2 of the fourth transistor T4 and the drain region 137g of the seventh transistor T7 are connected to the initialization voltage line 159. Thus, an additional connecting member may be formed at a different layer from the active pattern 130 and the second conductive layer. According to an exemplary embodiment of the present invention, however, it is possible to connect the source region 136d_2 of the fourth transistor T4 and the drain region 137g of the seventh transistor T7 with an initialization voltage line 159 through a contact hole 47, by allowing the active pattern 130 and the initialization voltage line 159 to overlap each other in the plan view and forming the contact hole 47 in the first and second insulating layers 141 and 142.

A manufacturing method of a display device according to an exemplary embodiment of the present invention will be described in more detail below with reference to FIG. 8 to FIG. 26 along with the aforementioned drawings.

Figure 8:
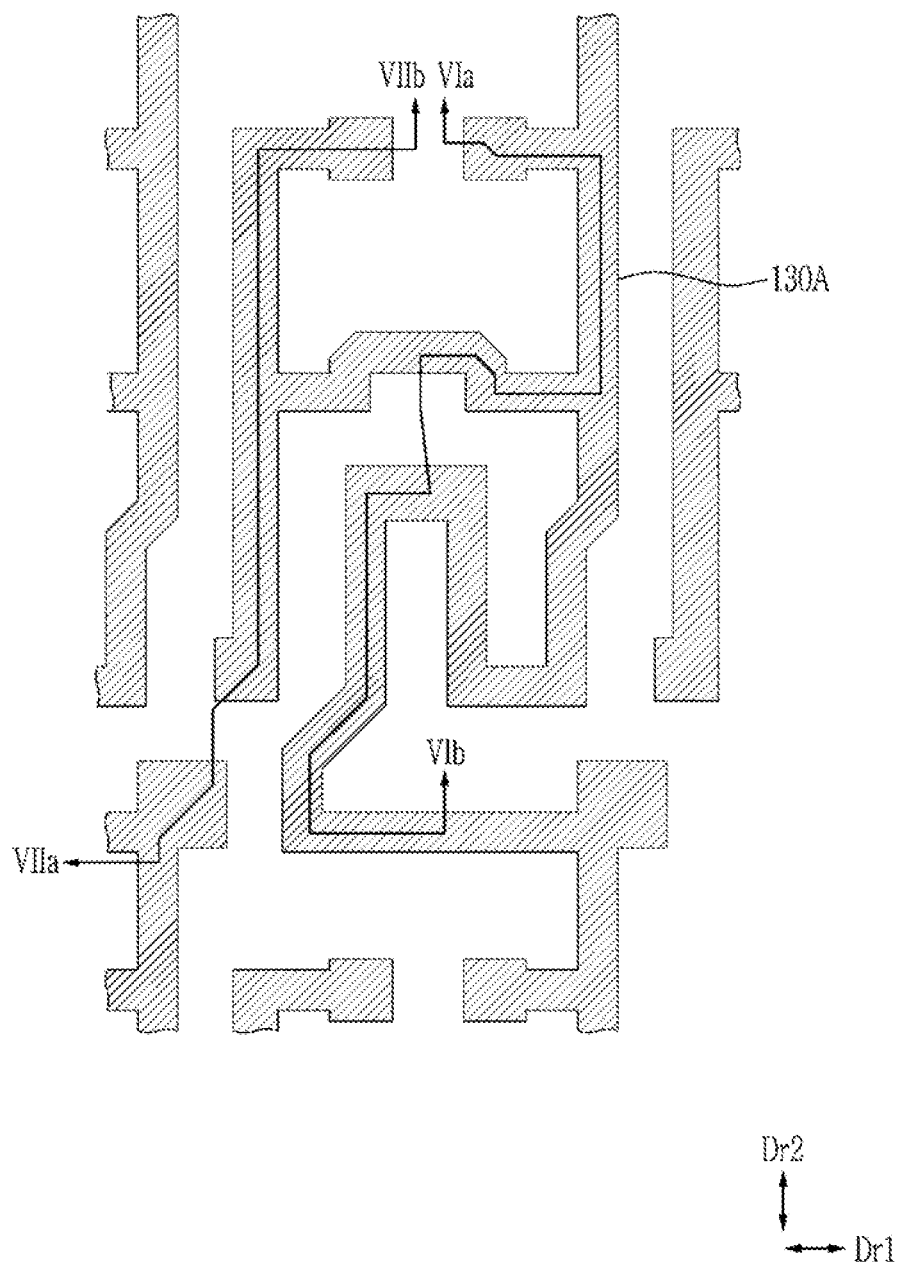
FIG. 8 is a layout view illustrating a pixel of a display device at a manufacturing step in a manufacturing method of a display device according to an exemplary embodiment of the present invention.
Figure 9:
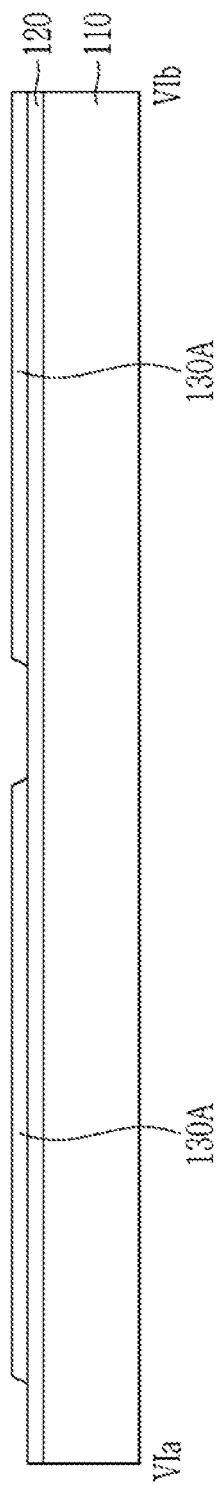
FIG. 9 is a cross-sectional view taken along a line VIa-VIb of the pixel of the display device according to the manufacturing step illustrated in FIG. 8.
Figure 10:
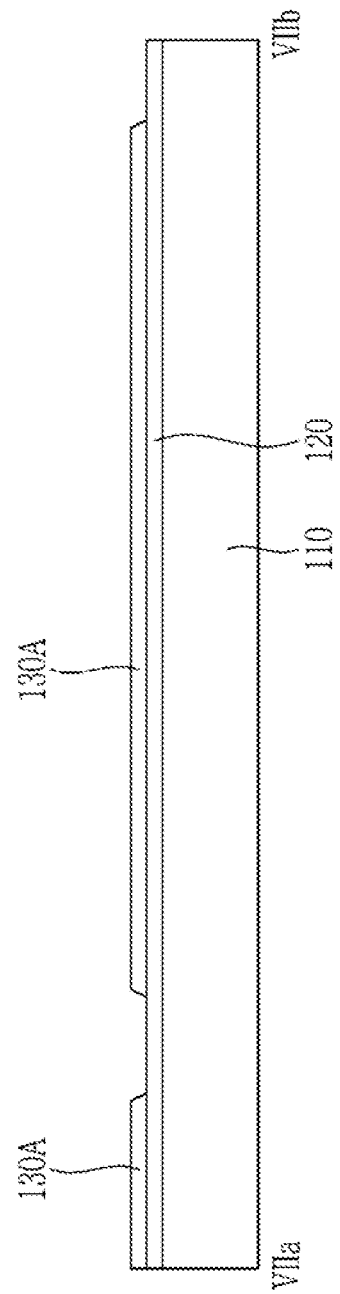
FIG. 10 is a cross-sectional view taken along a line VIIa-VIIb of the pixel of the display device according to the manufacturing step illustrated in FIG. 8.

FIG. 8 is a layout view illustrating a pixel of a display device at a manufacturing step in a manufacturing method of a display device according to an exemplary embodiment of the present invention. FIG. 9 is a cross-sectional view taken along a line VIa-VIb of the pixel of the display device according to the manufacturing step illustrated in FIG. 8. FIG. 10 is a cross-sectional view taken along a line VIIa-VIIb of the pixel of the display device according to the manufacturing step illustrated in FIG. 8.

Referring to FIG. 8 to FIG. 10, an inorganic insulating material and/or an organic insulating material may be stacked on the substrate 110 to form the buffer layer 120. A semiconductor material such as polycrystalline silicon or an oxide semiconductor may be stacked on the buffer layer 120 and patterned to form a semiconductor pattern 130A. The patterning process may include a photolithography process in which a photoresist is stacked on a target layer, a mask pattern is formed through an exposure and development process using a photomask, and then a target layer is etched. An overall planar shape of the semiconductor pattern 130A may be substantially the same as the planar shape of the active pattern 130 described above.

Figure 11:
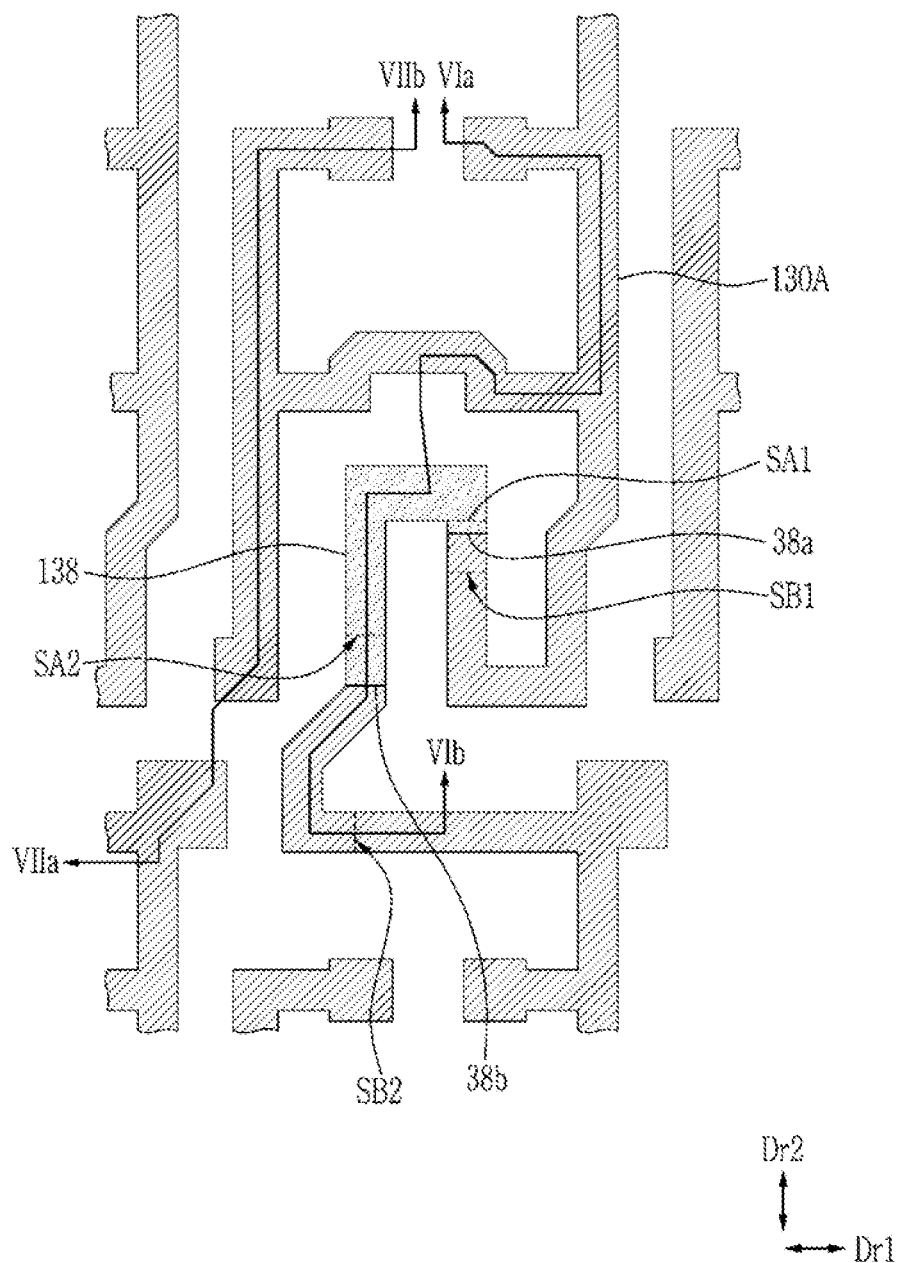
FIG. 11 is a layout view illustrating a pixel of a display device at a manufacturing step after the manufacturing step illustrated in FIG. 8.
Figure 12:
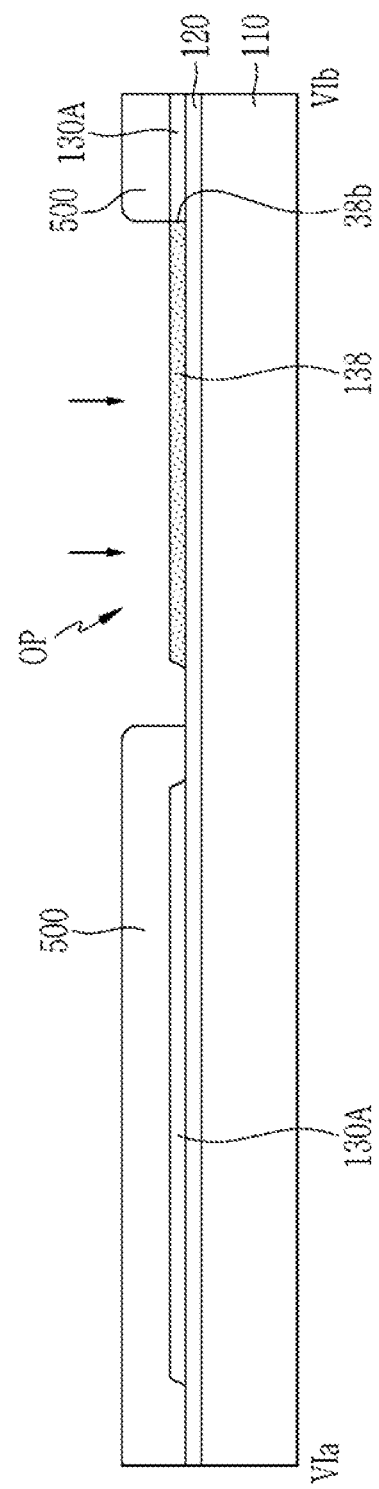
FIG. 12 is a cross-sectional view taken along a line VIa-VIb of the pixel of the display device according to the manufacturing step illustrated in FIG. 11.
Figure 13:
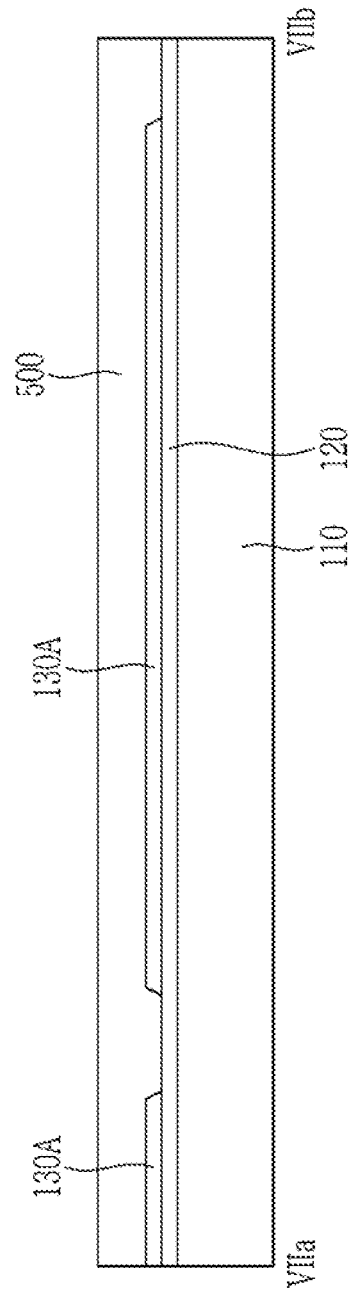
FIG. 13 is a cross-sectional view taken along a line VIIa-VIIb of the pixel of the display device according to the manufacturing step illustrated in FIG. 11.
Figure 14:
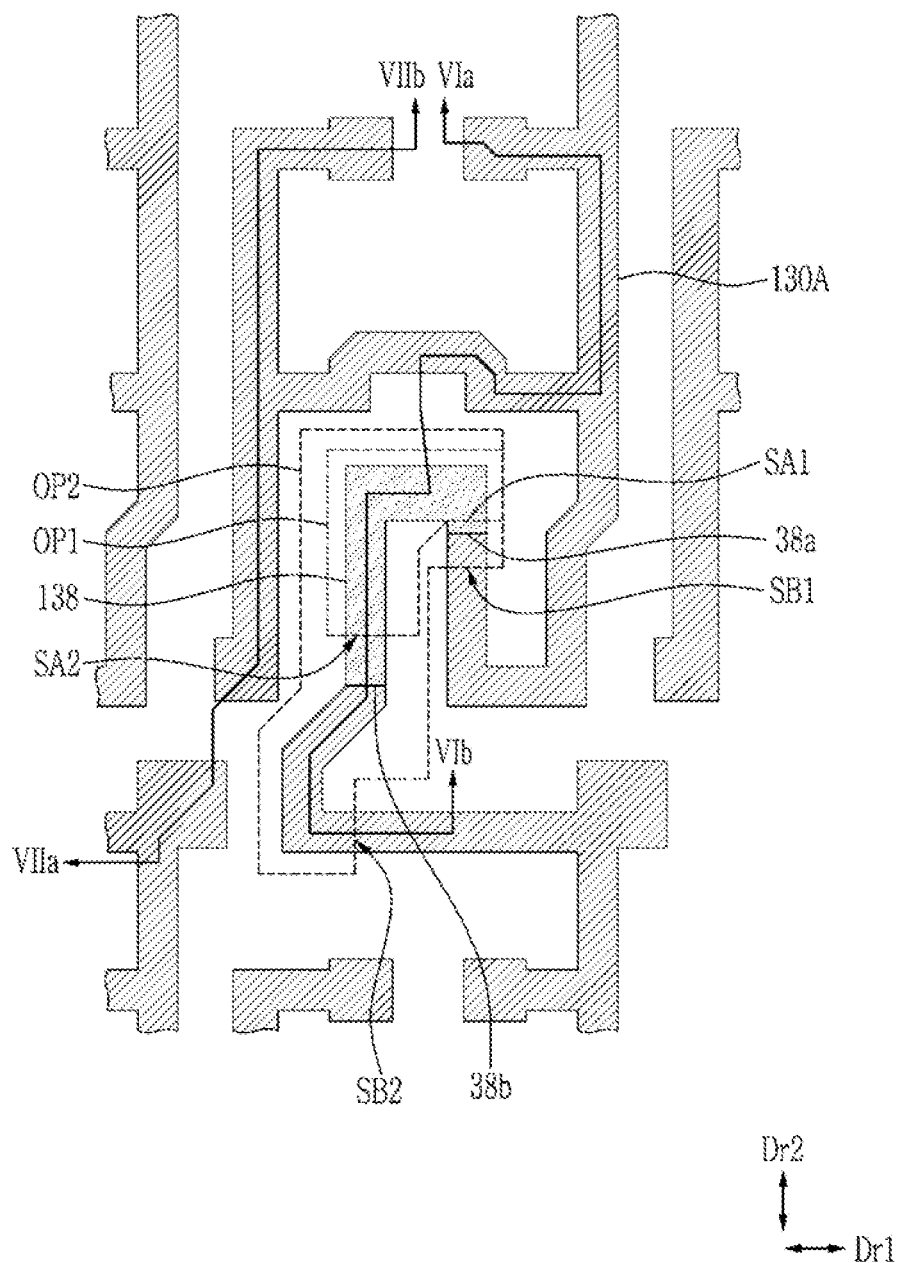
FIG. 14 is a layout view additionally illustrating an opening shape of a photomask used in the manufacturing step illustrated in FIG. 11 to FIG. 13.

FIG. 11 is a layout view illustrating a pixel of a display device at a manufacturing step after the manufacturing step illustrated in FIG. 8. FIG. 12 is a cross-sectional view taken along a line VIa-VIb of the pixel of the display device according to the manufacturing step illustrated in FIG. 11. FIG. 13 is a cross-sectional view taken along a line VIIa-VIIb of the pixel of the display device according to the manufacturing step illustrated in FIG. 11. FIG. 14 is a layout view additionally illustrating an opening shape of a photomask used in the manufacturing step illustrated in FIG. 11 to FIG. 13.

Referring to FIG. 11 to FIG. 13, a photosensitive layer such as a photoresist may be stacked on the semiconductor pattern 130A, and then exposed and developed to form a mask pattern 500 including an opening OP. The opening OP may include an area corresponding to the connector 138 of the active pattern 130 described above.

Subsequently, the semiconductor pattern 130A is firstly doped with N-type or P-type impurities by using the mask pattern 500 as a mask to form the connector 138 which is a conductive region. A position of the first end 38a of the connector 138 may be changed according to a shape of the opening OP of the mask pattern 500, and may range between, e.g., boundary lines SA1 and SB1 described with reference to FIG. 11. The boundary line SA1 may be in a position corresponding to a lower outer boundary line of the driving gate electrode 155a to be formed later, and a boundary line SB1 may be in a position corresponding to a boundary line between the channel region 131c_1 and the drain region 137c_1 of the third transistor first portion T3_1 to be formed later. Similarly, a position of the second end 38b of the connector 138 may be changed according to the shape of the opening OP of the mask pattern 500, and may range between, e.g., boundary lines SA2 and SB2 described with reference to FIG. 11. The boundary line SA2 may be in a position corresponding to a lower outer boundary line of the first scan line 151 to be formed later, and the boundary line SB2 may be in a position corresponding to a boundary line between the channel region 131d_1 and the drain region 137d_1 of the fourth transistor first portion T41 to be formed later.

Thus, the shape of the opening OP of the mask pattern 500 may be variously changed depending on a region of the connector 138 to be formed. For example, referring to FIG. 14, a minimum area of an opening OP1 of the mask pattern 500 according to an exemplary embodiment of the present invention may have an edge aligned with the boundary line SA2 and the boundary line SA1 described with reference to FIG. 11 and FIG. 14. A maximum area of the opening OP2 of the mask pattern 500 according to an exemplary embodiment of the present invention may have an edge aligned with the boundary line SB2 and the boundary line SB1 described with reference to FIG. 11 and FIG. 14.

Figure 15:
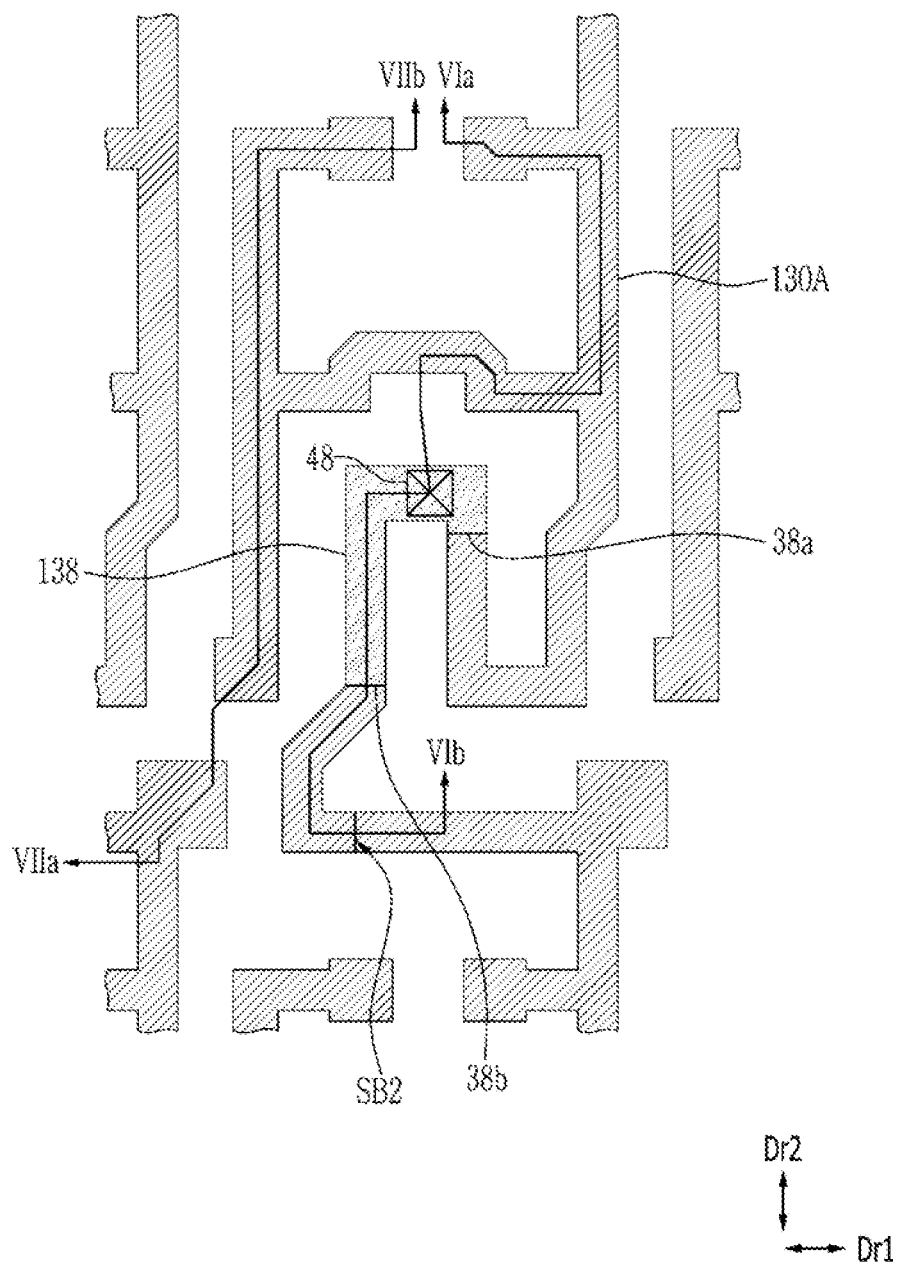
FIG. 15 is a layout view of a pixel of the display device at a manufacturing step after the manufacturing step illustrated in FIG. 11.
Figure 16:
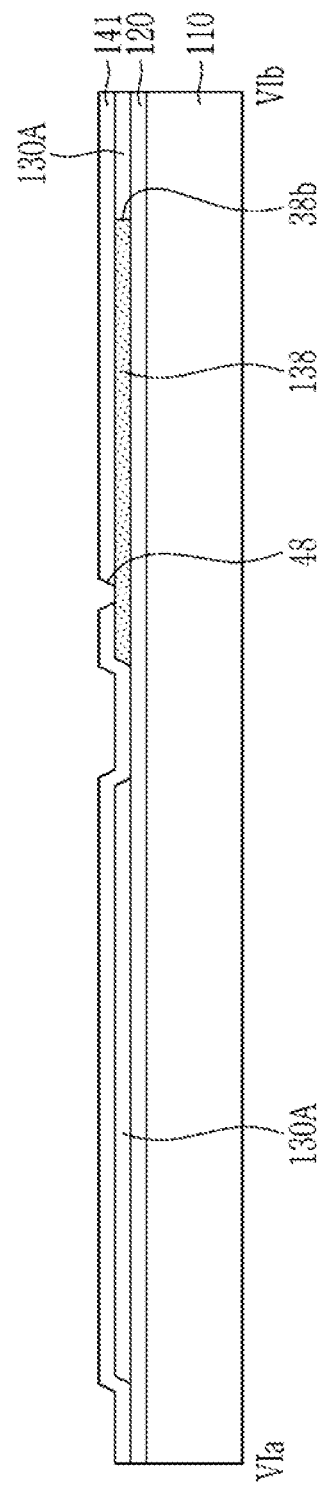
FIG. 16 is a cross-sectional view taken along a line VIa-VIb of the pixel of the display device according to the manufacturing step illustrated in FIG. 15.
Figure 17:
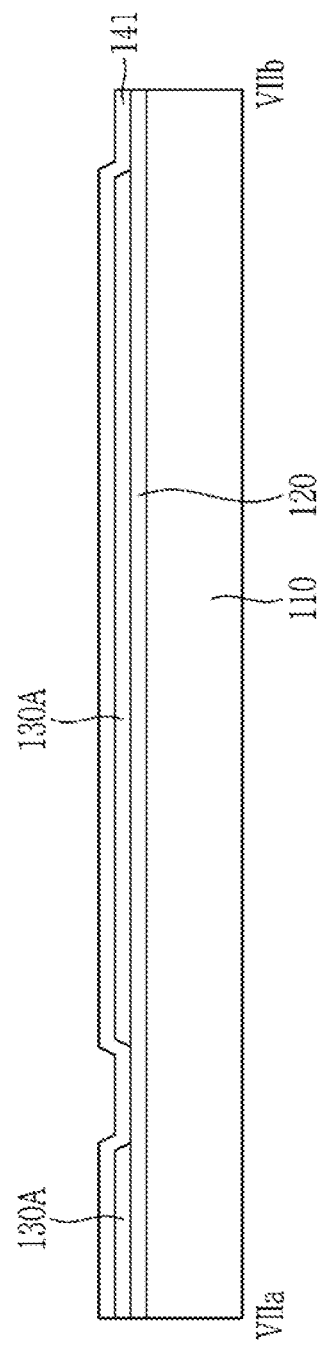
FIG. 17 is a cross-sectional view taken along a line VIIa-VIIb of the pixel of the display device according to the manufacturing step illustrated in FIG. 15.

FIG. 15 is a layout view of a pixel of the display device at a manufacturing step after the manufacturing step illustrated in FIG. 11. FIG. 16 is a cross-sectional view taken along a line VIa-VIb of the pixel of the display device according to the manufacturing step illustrated in FIG. 15. FIG. 17 is a cross-sectional view taken along a line VIIa-VIIb of the pixel of the display device according to the manufacturing step illustrated in FIG. 15.

Referring to FIG. 15 to FIG. 17, a first insulating layer 141 may be formed by stacking an inorganic insulating material such as a silicon nitride or a silicon oxide and/or an organic insulating material on the semiconductor pattern 130A, and the first insulating layer 141 may be patterned to form a contact hole 48 above the connector 138.

Figure 18:
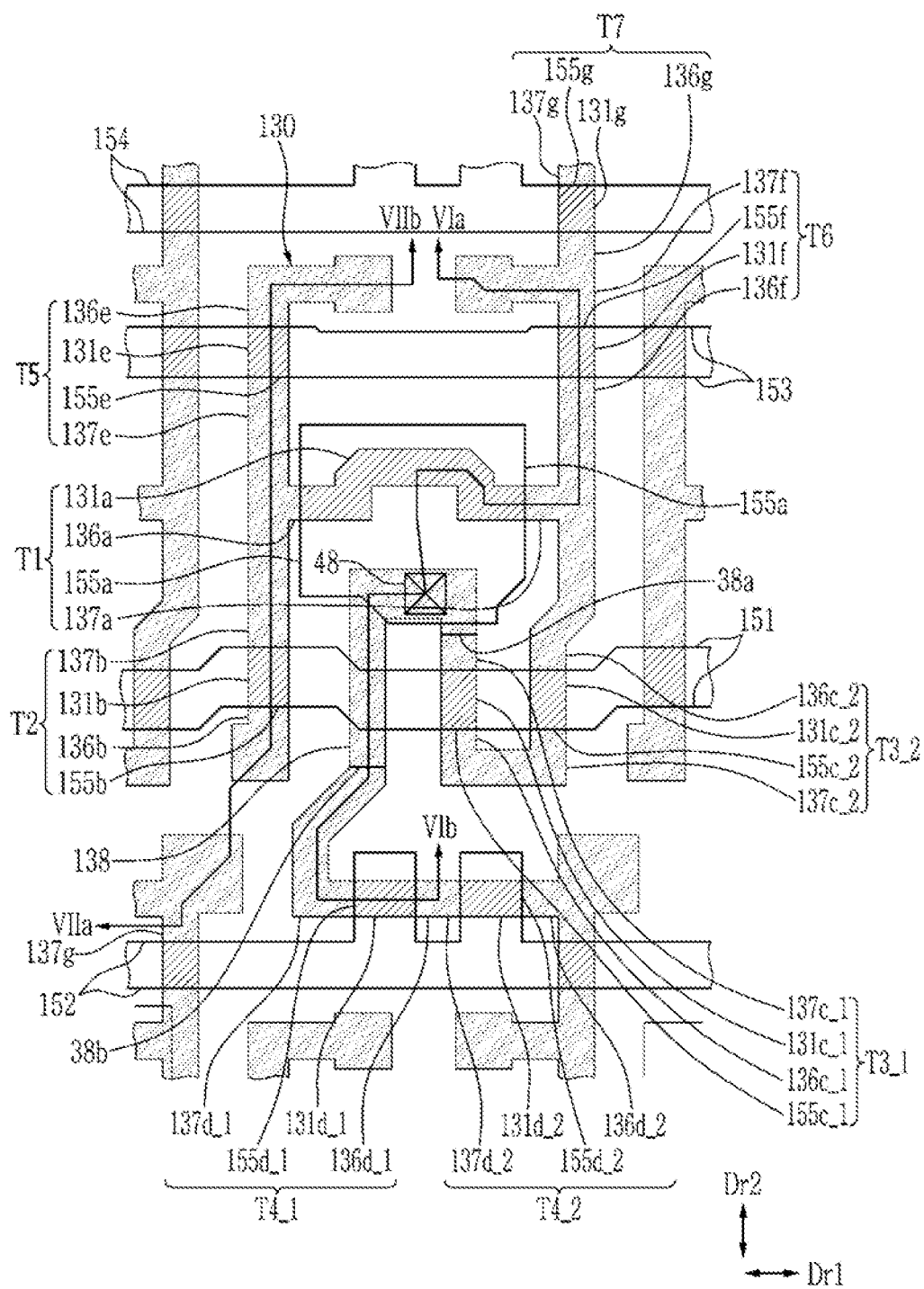
FIG. 18 is a layout view illustrating a pixel of a display device at a manufacturing step after the manufacturing step illustrated in FIG. 15.
Figure 19:
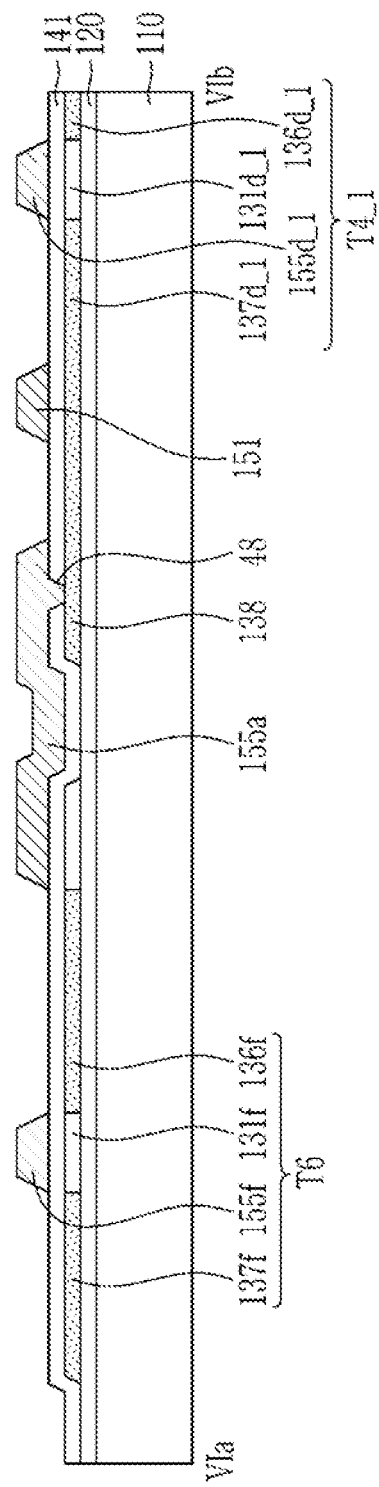
FIG. 19 is a cross-sectional view taken along a line VIa-VIb of the pixel of the display device according to the manufacturing step illustrated in FIG. 18.
Figure 20:
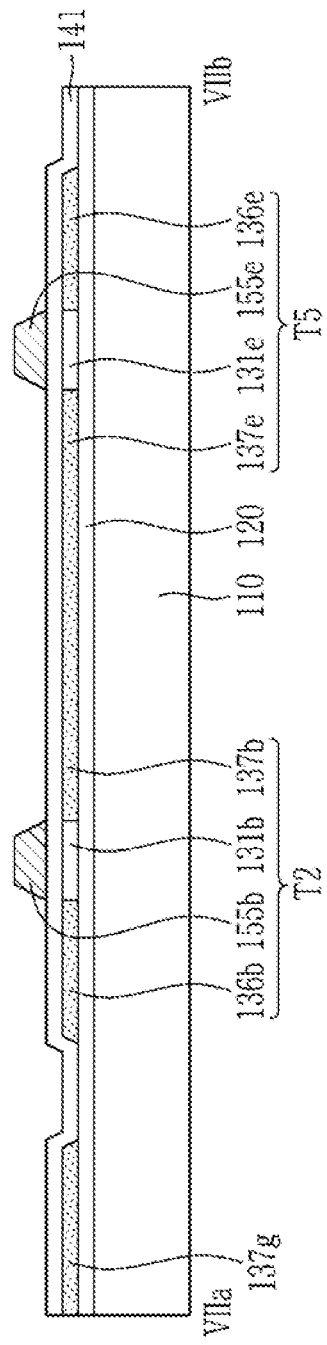
FIG. 20 is a cross-sectional view taken along a line VIIa-VIIb of the pixel of the display device according to the manufacturing step illustrated in FIG. 18.

FIG. 18 is a layout view illustrating a pixel of a display device at a manufacturing step after the manufacturing step illustrated in FIG. 15. FIG. 19 is a cross-sectional view taken along a line VIa-VIb of the pixel of the display device according to the manufacturing step illustrated in FIG. 18. FIG. 20 is a cross-sectional view taken along a line VIIa-VIIb of the pixel of the display device according to the manufacturing step illustrated in FIG. 18.

Referring to FIG. 18 to FIG. 20, a first conductive layer including a plurality of scan lines 151, 152, and 154, the control line 153, and the driving gate electrode 155a may be formed by stacking a conductive material such as a metal, e.g., copper (Cu), aluminum (Al), molybdenum (Mo), titanium (Ti), tantalum (Ta), or an alloy of at least two thereof on the first insulating layer 141 and patterning it. The driving gate electrode 155a is electrically connected to the connector 138 through the contact hole 48.

Subsequently, the semiconductor pattern 130A may be doped with N-type or P-type impurities by using the first conductive layer as a mask to form remaining conductive regions, thus completing the active pattern 130 as described above.

Figure 21:
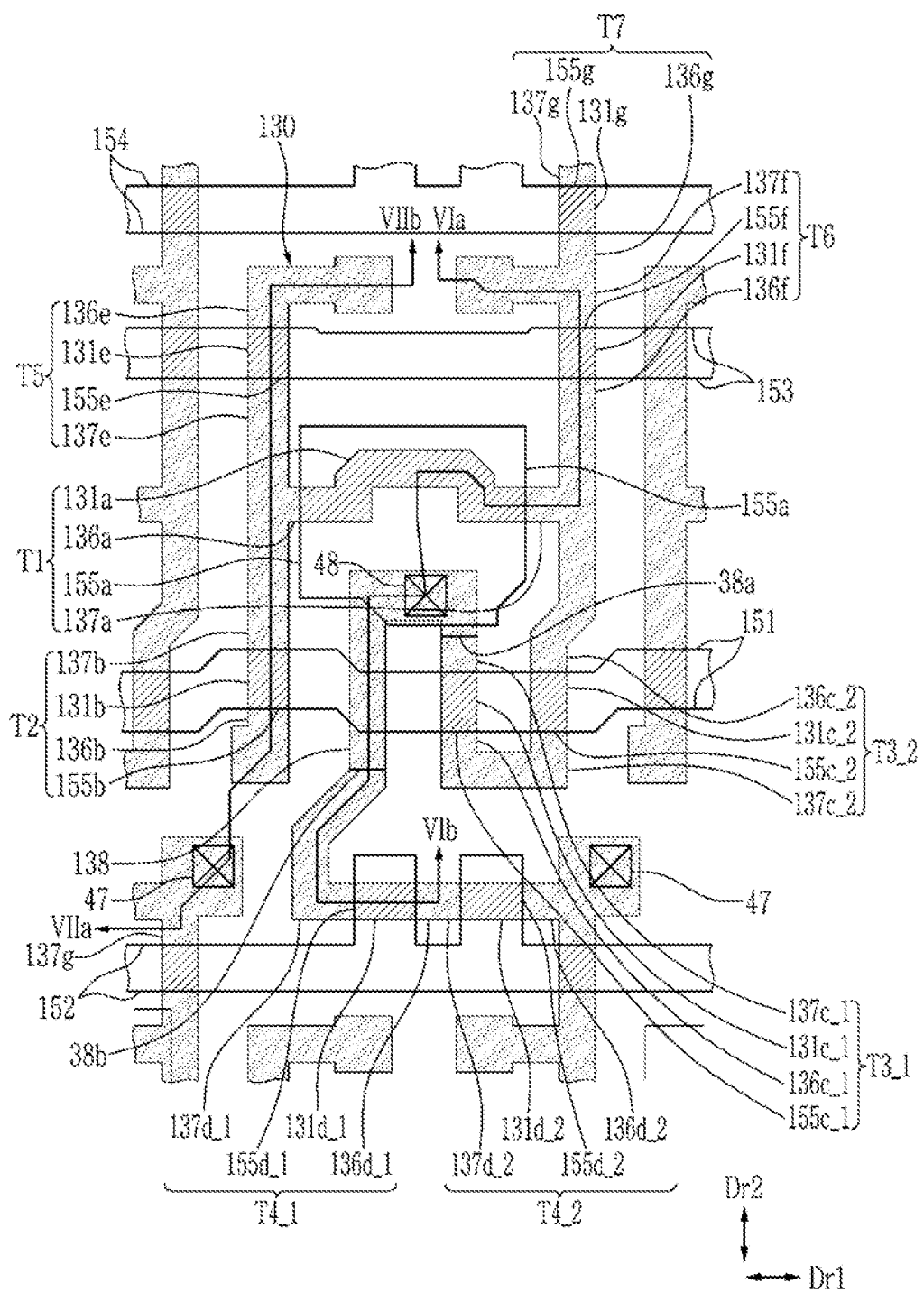
FIG. 21 is a layout view illustrating a pixel of a display device at a manufacturing step after the manufacturing step illustrated in FIG. 18.
Figure 22:
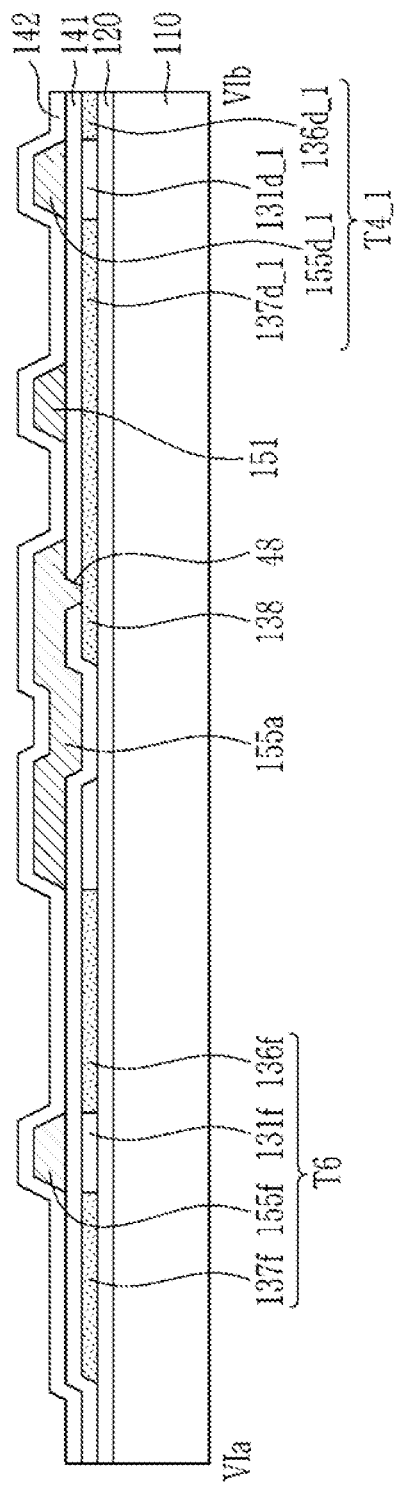
FIG. 22 is a cross-sectional view taken along a line VIa-VIb of the pixel of the display device according to the manufacturing step illustrated in FIG. 21.
Figure 23:
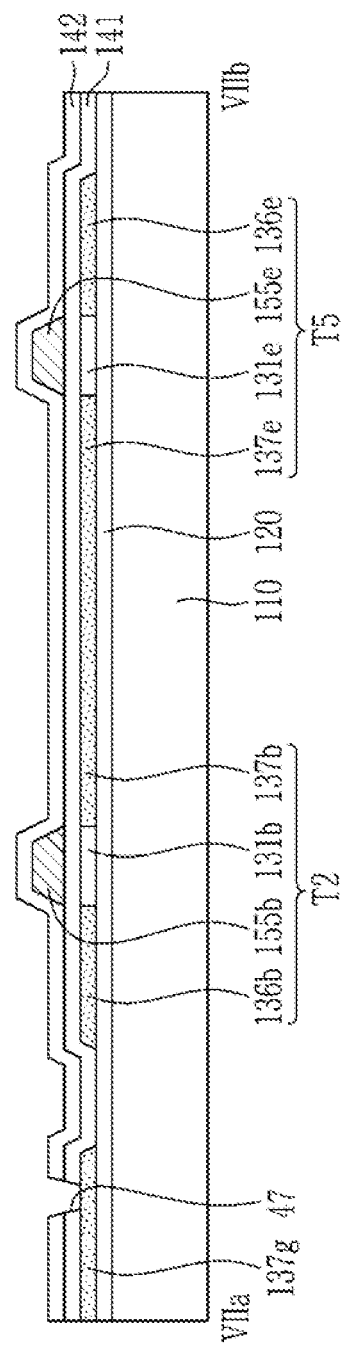
FIG. 23 is a cross-sectional view taken along a line VIIa-VIIb of the pixel of the display device according to the manufacturing step illustrated in FIG. 21.

FIG. 21 is a layout view illustrating a pixel of a display device at a manufacturing step after the manufacturing step illustrated in FIG. 18. FIG. 22 is a cross-sectional view taken along a line VIa-VIb of the pixel of the display device according to the manufacturing step illustrated in FIG. 21. FIG. 23 is a cross-sectional view taken along a line VIIa-VIIb of the pixel of the display device according to the manufacturing step illustrated in FIG. 21.

Referring to FIG. 21 to FIG. 23, an inorganic insulating material such as a silicon nitride or a silicon oxide and/or an organic insulating material may be stacked on the first insulating layer 141 and the first conductive layer to form the second insulating layer 142. Subsequently, the contact hole 47 positioned above the source region 136d_2 of the second portion T4_2 of the fourth transistor T4 or the drain region 137 g of the seventh transistor T7 may be formed by patterning the first and second insulating layers 141 and 142 by a photolithography process or the like.

Figure 24:
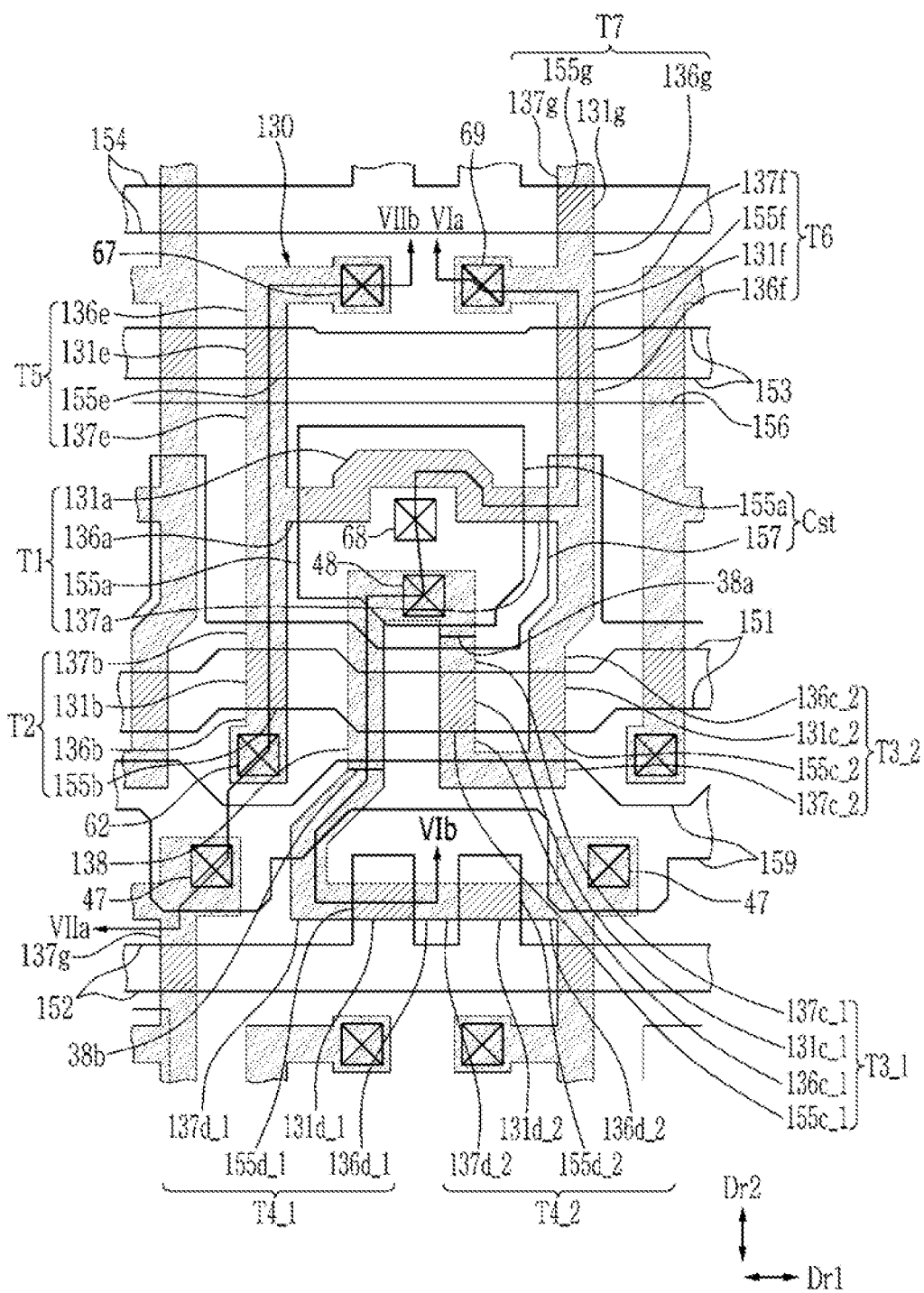
FIG. 24 is a layout view illustrating a pixel of a display device at a manufacturing step after the manufacturing step illustrated in FIG. 21.
Figure 25:
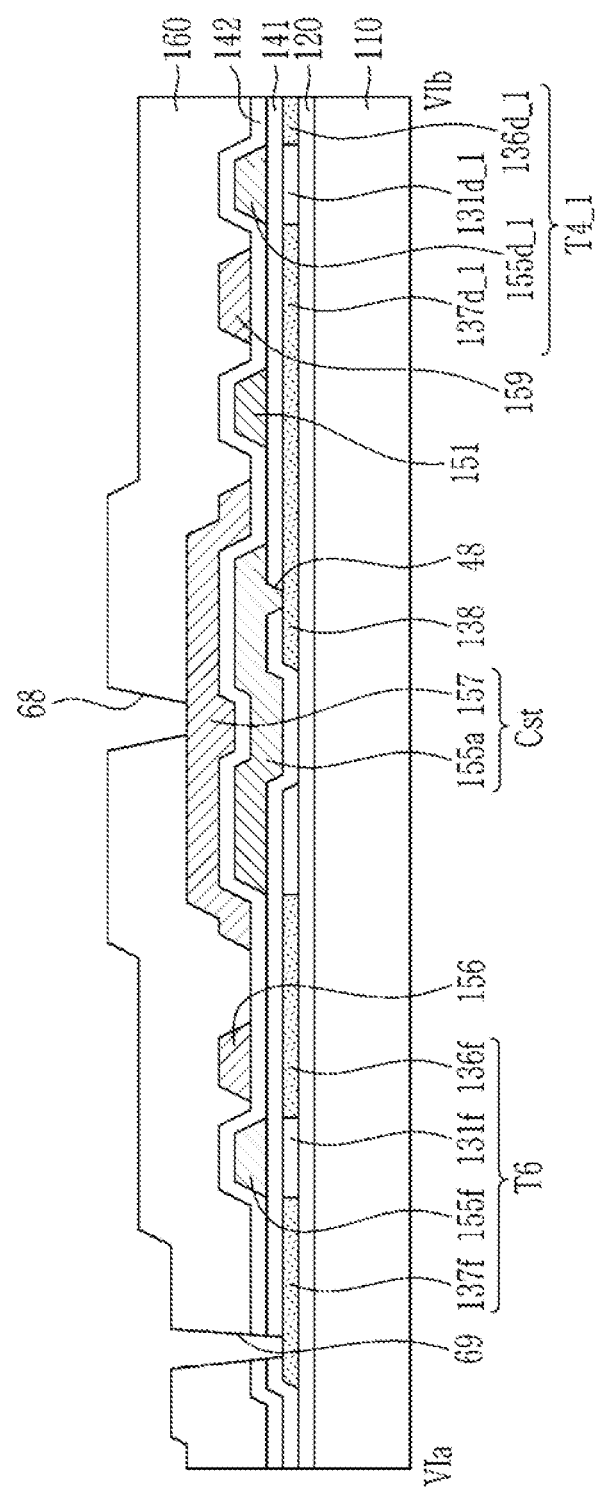
FIG. 25 is a cross-sectional view taken along a line VIa-VIb of the pixel of the display device according to the manufacturing step illustrated in FIG. 24.
Figure 26:
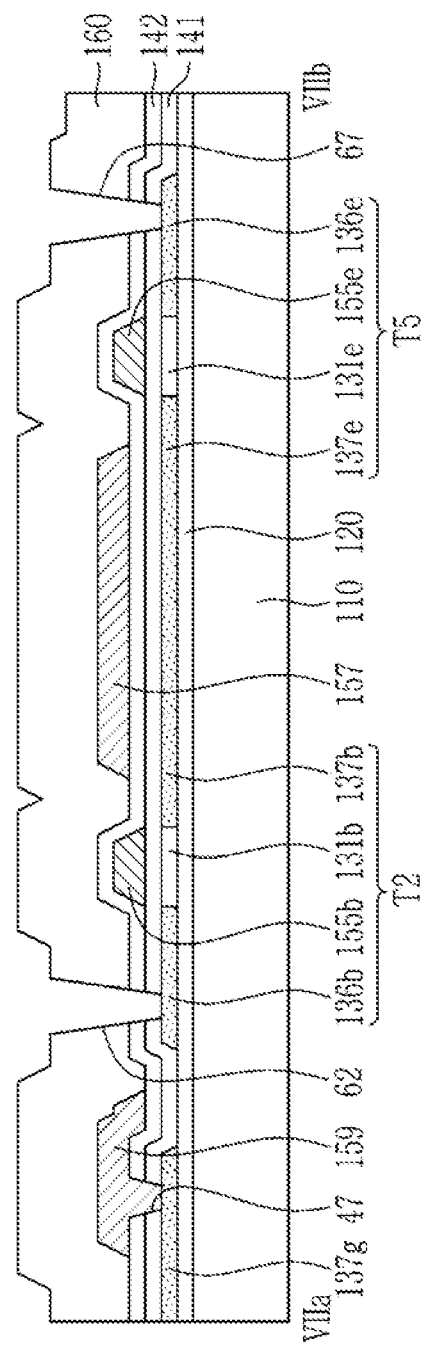
FIG. 26 is a cross-sectional view taken along a line VIIa-VIIb of the pixel of the display device according to the manufacturing step illustrated in FIG. 24.

FIG. 24 is a layout view illustrating a pixel of a display device at a manufacturing step after the manufacturing step illustrated in FIG. 21. FIG. 25 is a cross-sectional view taken along a line VIa-VIb of the pixel of the display device according to the manufacturing step illustrated in FIG. 24. FIG. 26 is a cross-sectional view taken along a line VIIa-VIIb of the pixel of the display device according to the manufacturing step illustrated in FIG. 24.

Referring to FIG. 24 to FIG. 26, a second conductive layer including a storage line 156 and an initialization voltage line 159 may be formed by stacking a conductive material such as a metal, e.g., copper (Cu), aluminum (Al), molybdenum (Mo), titanium (Ti), tantalum (Ta), or an alloy of at least two thereof on the second insulating layer 142 and patterning it. The initialization voltage line 159 may be electrically connected to the drain region 137g of the seventh transistor T7 or the source region 136d_2 of the second portion T4_2 of the fourth transistor T7 through the contact hole 47.

Subsequently, an inorganic insulating material and/or an organic insulating material may be stacked on the second insulating layer 142 and the second conductive layer to form a third insulating layer 160. The contact hole 62 positioned above the source region 136b of the second transistor T2, the contact hole 67 positioned above the source region 136e of the fifth transistor T5, the contact hole 69 positioned above n the drain region 137f of the sixth transistor T6, and the contact hole 68 positioned above the expansion 157 of the storage line 156 may be formed by patterning the first insulating layer 141, the second insulating layer 142, and the third insulating layer 160.

Figure 6:
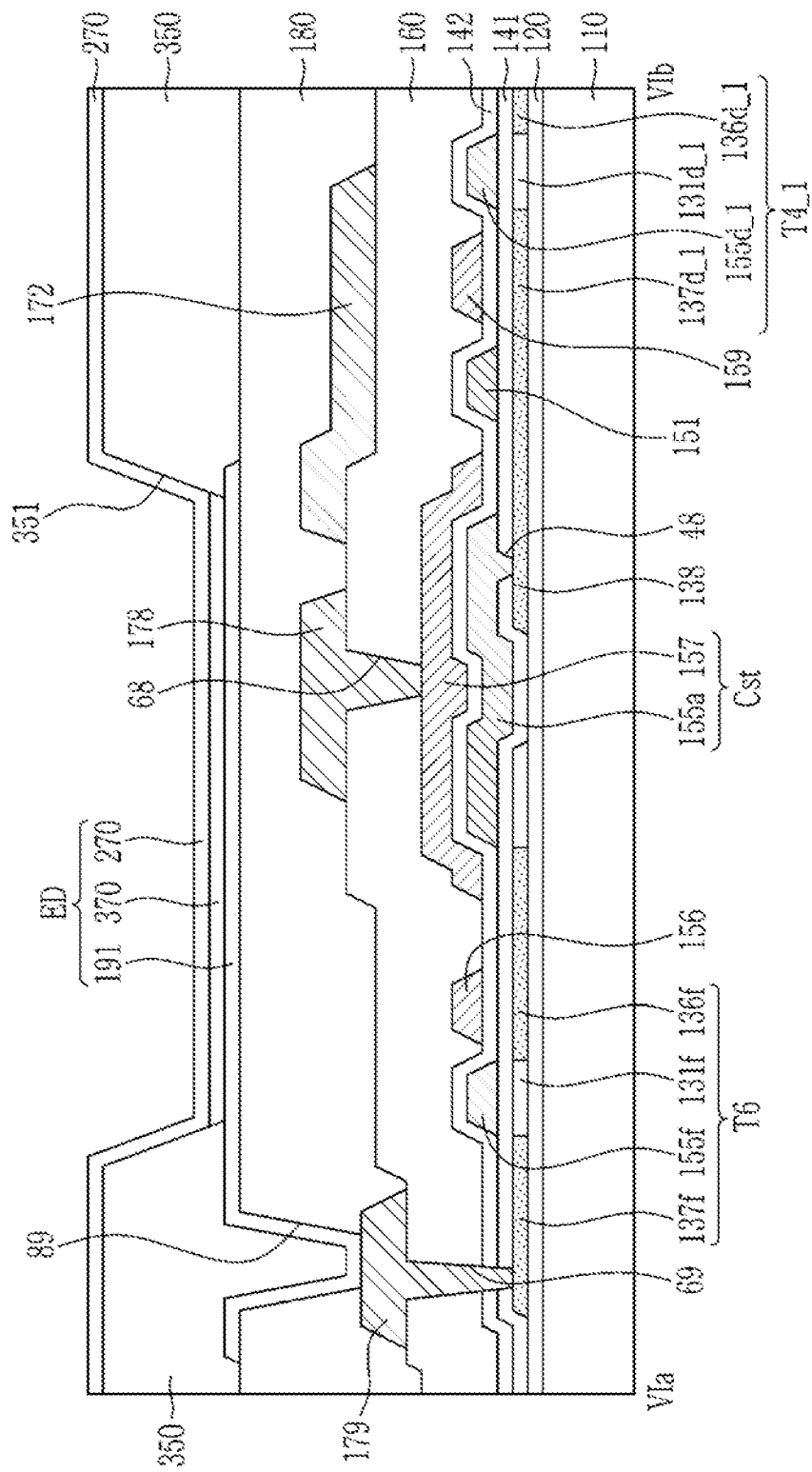
FIG. 6 is a cross-sectional view taken along a line IVa-IVb of the pixel of the display device illustrated in FIG. 5.
Figure 7:
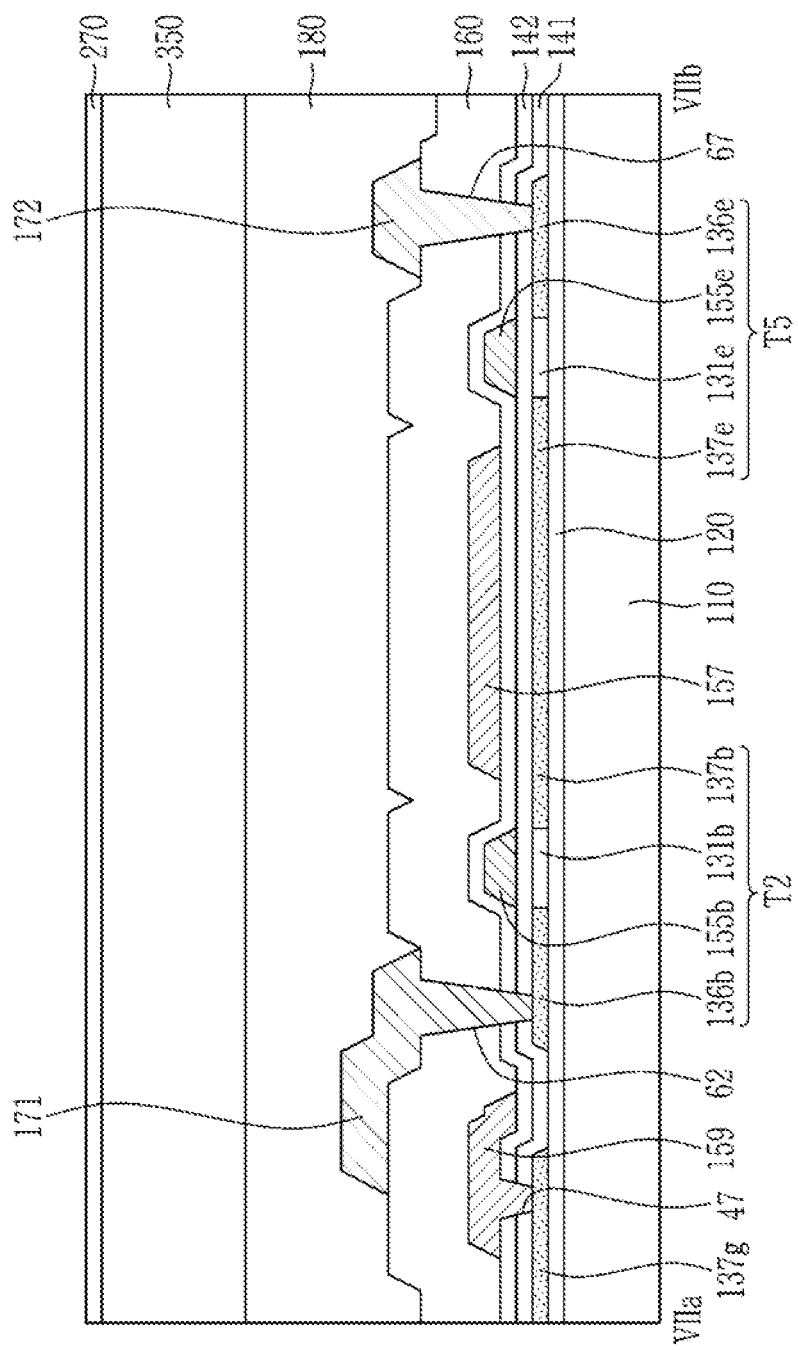
FIG. 7 is a cross-sectional view taken along a line Va-Vb of the pixel of the display device illustrated in FIG. 5.

Referring to FIG. 5 to FIG. 7, a third conductive layer including the data line 171, the driving voltage line 172, and the connecting member 179 may be formed by stacking a conductive material such as a metal, e.g., copper (Cu), aluminum (Al), molybdenum (Mo), titanium (Ti), tantalum (Ta), or an alloy of at least two thereof on the third insulating layer 160 and patterning it. Subsequently, the passivation layer 180 including the contact hole 89 positioned above the connecting member 179 may be formed by stacking an organic insulating material or the like on the third conductive layer and the third insulating layer 160 and patterning it.

Subsequently, a conductive material such as ITO may be stacked on the passivation layer 180 and patterned to form a fourth conductive layer including the pixel electrode 191. Subsequently, the pixel definition layer 350 is formed on the pixel electrode 191 and the passivation layer 180, and the emission layer 370 and the common electrode 270 may be formed to form the light emitting diode ED. Subsequently, an encapsulation layer protecting the light emitting diode ED may be formed.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a substrate;
   an active pattern positioned above the substrate, wherein the active pattern includes a channel region and a conductive region having a higher carrier concentration than the channel region;
   a first insulating layer disposed on the active pattern; and
   a first conductive layer disposed on the first insulating layer and including a first conductor and a second conductor separated from each other,
   wherein the channel region of the active pattern includes a first channel region overlapping the first conductor along a direction orthogonal to an upper surface of the substrate,
   wherein the conductive region of the active pattern includes a first conductive region overlapping the first conductor along the direction orthogonal to the upper surface of the substrate,
   wherein the first conductive region includes a first portion overlapping the first conductor along the direction orthogonal to the upper surface of the substrate and a second portion connected with the first portion and not overlapping the first conductor along the direction orthogonal to the upper surface of the substrate,
   the channel region of the active pattern further includes a second channel region overlapping the second conductor along the direction orthogonal to the upper surface of the substrate, and the second portion is connected with the second channel region, and the second portion of the first conductive region overlaps the second conductor along the direction orthogonal to the upper surface of the substrate.

2. The display device of claim 1, wherein the first conductive layer further includes a third conductor that is separated from the first conductor and the second conductor, and the second portion of the first conductive region is insulated from and crosses the second conductor.

3. The display device of claim 1, wherein the first insulating layer has a contact hole overlapping the first conductor along the direction orthogonal to the upper surface of the substrate, and the first conductive region is electrically connected to the first conductor through the contact hole.

4. A display device comprising:
an active pattern including a plurality of channel regions and a conductive region having a higher carrier concentration than the channel regions;
a first insulating layer disposed on the active pattern; and
a first conductive layer disposed on the first insulating layer,
wherein the first conductive layer includes a first gate electrode,
the channel regions of the active pattern include a first channel region overlapping the first gate electrode along a direction orthogonal to an upper surface of the substrate, and
the conductive region of the active pattern includes a connector overlapping the first gate electrode along the direction orthogonal to the upper surface of the substrate and separated from the first channel region, the display device further comprising:
a second insulating layer disposed on the first conductive layer; and
a second conductive layer disposed on the second insulating layer;
wherein the second conductive layer includes a storage line,
the storage line includes an expansion overlapping the first gate electrode along the direction orthogonal to the upper surface of the substrate with the second insulating layer disposed between the expansion and the first gate electrode to form a capacitor.

5. The display device of claim 4, wherein the channel regions of the active pattern further include a second channel region which is separated from the first channel region and overlaps a second gate electrode included in the first conductive layer along the direction orthogonal to the upper surface of the substrate, and the connector is connected with the second channel region or a portion of the conductive region connected with the second channel region.

6. The display device of claim 5, wherein the first insulating layer has a first contact hole formed above the first gate electrode, and the connector is electrically connected to the first gate electrode through the first contact hole.

7. The display device of claim 6, wherein the first conductive layer further includes a first scan line disposed between the first gate electrode and the second gate electrode, and the connector is insulated from and crosses the first scan line.

8. The display device of claim 7, wherein the channel regions of the active pattern further include a third channel region which is separated from the first channel region and overlaps the first scan line along the direction orthogonal to the upper surface of the substrate, and the connector is connected with the third channel region or a portion of the conductive region connected with the third channel region.

9. The display device of claim 8, wherein the active pattern is physically continuous from the first channel region, via the third channel region, and to the connector.

10. The display device of claim 4, wherein the expansion has a continuous planar shape with no opening therein.

11. The display device of claim 10, further comprising:
a third insulating layer disposed on the second conductive layer; and
a third conductive layer disposed on the third insulating layer,
wherein the third conductive layer includes a driving voltage line for transferring a driving voltage,
the third insulating layer includes a second contact hole overlapping the expansion along the direction orthogonal to the upper surface of the substrate, and
the driving voltage line is electrically connected to the expansion through the second contact hole.

12. The display device of claim 10, wherein the first insulating layer and the second insulating layer have a third contact hole overlapping a portion of the conductive region of the active pattern along the direction orthogonal to the upper surface of the substrate,
the second conductive layer includes an initialization voltage line for transferring an initialization voltage, and
the initialization voltage line is electrically connected to a portion of the conductive region of the active pattern through the third contact hole.

13. The display device of claim 4, wherein the first conductive layer further includes a first scan line separated from the first gate electrode,
the channel regions of the active pattern include a portion overlapping the first scan line along the direction orthogonal to the upper surface of the substrate, and
the conductive region of the active pattern includes a portion overlapping the first scan line along the direction orthogonal to the upper surface of the substrate.

14. A manufacturing method of a display device, the method comprising:
forming a semiconductor pattern on a substrate;
forming a conductive connector by doping a portion of the semiconductor pattern;
forming a first insulating layer on the semiconductor pattern;
forming a first contact hole above the connector by patterning the first insulating layer;
forming a first conductive layer by stacking a conductive material on the first insulating layer and patterning the stacked conductive material;
forming an active pattern including a plurality of conductive regions and a plurality of channel regions by doping the semiconductor pattern using the first conductive layer as a mask, wherein the first conductive layer includes a first gate electrode electrically connected to the connector through the first contact hole;
after the forming of the active pattern,
forming a second insulating layer on the first conductive layer; and forming a second conductive layer by stacking a conductive material on the second insulating layer and patterning the stacked conductive material, wherein the second conductive layer includes a storage line including an expansion overlapping the first gate electrode along a direction orthogonal to an upper surface of the substrate with the second insulating layer disposed between the expansion and the first gate electrode to form a capacitor.

15. The manufacturing method of claim 14, further comprising:

after the forming of the active pattern, forming a second contact hole overlapping a portion of the conductive region along the direction orthogonal to the upper surface of the substrate by patterning the first insulating layer and the second insulating layer.

16. The manufacturing method of claim 15, wherein the second conductive layer includes an initialization voltage line electrically connected to a portion of the conductive region through the second contact hole.

17. The display device of claim 1, further comprising a connector overlapping a first gate electrode of the first conductive layer along the direction orthogonal to the upper surface of the substrate, wherein the connector is spaced apart from the first channel region.

* * * * *